US012698393B2

(12) United States Patent
Hoshino et al.

(10) Patent No.: US 12,698,393 B2
(45) Date of Patent: Aug. 4, 2026

(54) RESIN COMPOSITION, PREPREG, FILM PROVIDED WITH RESIN, METAL FOIL PROVIDED WITH RESIN, METAL-CLAD LAMINATE, AND WIRING BOARD

(71) Applicant: PANASONIC INTELLECTUAL PROPERTY MANAGEMENT CO., LTD., Osaka (JP)

(72) Inventors: Yasunori Hoshino, Hyogo (JP); Yuki Kitai, Osaka (JP); Mikio Sato, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 626 days.

(21) Appl. No.: 18/015,882

(22) PCT Filed: Jul. 13, 2021

(86) PCT No.: PCT/JP2021/026271

§ 371 (c)(1),
(2) Date: Jan. 12, 2023

(87) PCT Pub. No.: WO2022/014582

PCT Pub. Date: Jan. 20, 2022

(65) Prior Publication Data

US 2023/0272213 A1 Aug. 31, 2023

(30) Foreign Application Priority Data

Jul. 17, 2020 (JP) ................................ 2020-122559

(51) Int. Cl.

*C08L 71/12* (2006.01)
*C08J 5/24* (2006.01)

(Continued)

(52) U.S. Cl.

CPC ................ *C08L 71/12* (2013.01); *C08J 5/24* (2013.01); *C08J 7/0427* (2020.01); *C08K 3/22* (2013.01);

(Continued)

(58) Field of Classification Search

CPC ........ C08L 71/12; C08L 71/126; C08L 23/22; C08L 25/08; C08L 25/16; C09D 71/12;

(Continued)

(56) References Cited

U.S. PATENT DOCUMENTS

2014/0113118 A1* 4/2014 Wang ..................... B32B 15/20 428/209
2014/0349105 A1 11/2014 Yamazaki et al.

(Continued)

FOREIGN PATENT DOCUMENTS

CN 1745142 A 3/2006
CN 109988409 A 7/2019

(Continued)

OTHER PUBLICATIONS

Partial machine translation of JP 2008-050526 A (Year: 2008).*
ISR issued in International Patent Application No. PCT/JP2021/026271, Sep. 14, 2021, translation.

*Primary Examiner* — Kregg T Brooks
(74) *Attorney, Agent, or Firm* — GREENBLUM & BERNSTEIN, P.L.C.

(57) ABSTRACT

A resin composition includes: a polyphenylene ether compound having at least one of groups expressed by formulas (1) and (2), a curing agent reactable with the polyphenylene ether compound, a styrene-based polymer having structural units expressed by formulas (3) and (4); and an inorganic filler containing boron nitride, wherein a content of the inorganic filler is 100 to 320 parts by mass relative to 100

(Continued)

parts by mass of a total of the polyphenylene ether compound, the curing agent, and the styrene-based polymer.

19 Claims, 5 Drawing Sheets

(51) Int. Cl.

| | |
|---|---|
| ***C08J 7/04*** | (2020.01) |
| ***C08K 3/22*** | (2006.01) |
| ***C08K 3/36*** | (2006.01) |
| ***C08K 3/38*** | (2006.01) |
| ***C08K 5/16*** | (2006.01) |
| ***H05K 1/03*** | (2006.01) |

(52) U.S. Cl.
CPC .................. *C08K 3/36* (2013.01); *C08K 5/16* (2013.01); *H05K 1/0373* (2013.01); *C08J 2325/08* (2013.01); *C08J 2371/12* (2013.01); *C08K 2003/2227* (2013.01); *C08K 2003/385* (2013.01); *C08K 2201/014* (2013.01)

(58) Field of Classification Search
CPC ....... C09D 171/12; C09J 71/12; C09J 171/12; C08J 2371/12; C08K 3/36; C08K 2003/385
See application file for complete search history.

(56) References Cited

U.S. PATENT DOCUMENTS

| | | | | |
|---|---|---|---|---|
| 2016/0362527 | A1* | 12/2016 | Koes | H05K 1/0373 |
| 2017/0335160 | A1 | 11/2017 | Yamazaki et al. | |
| 2020/0001573 | A1 | 1/2020 | Saito et al. | |
| 2021/0032404 | A1* | 2/2021 | Shigaki | B32B 15/20 |
| 2021/0221743 | A1 | 7/2021 | Huang | |

FOREIGN PATENT DOCUMENTS

| | | | | | |
|---|---|---|---|---|---|
| CN | 110366569 | A | | 10/2019 | |
| EP | 0572667 | A1 | * | 12/1993 | C08L 25/06 |
| JP | 2008050526 | A | * | 3/2008 | |
| JP | 2008-214578 | A | | 9/2008 | |
| JP | 2013-241321 | A | | 12/2013 | |
| JP | 2014-001277 | A | | 1/2014 | |
| JP | 2014-208818 | A | | 11/2014 | |
| JP | 2015-067700 | A | | 4/2015 | |
| WO | WO-2018093987 | A1 | * | 5/2018 | H01L 23/3737 |
| WO | WO-2018159080 | A1 | * | 9/2018 | H05K 1/0353 |
| WO | WO-2019138992 | A1 | * | 7/2019 | C08J 5/249 |

* cited by examiner

RESIN COMPOSITION, PREPREG, FILM PROVIDED WITH RESIN, METAL FOIL PROVIDED WITH RESIN, METAL-CLAD LAMINATE, AND WIRING BOARD

TECHNICAL FIELD

The present invention relates to a resin composition, a prepreg, a film with a resin, a metal foil with a resin, a metal-clad laminate, and a wiring board.

BACKGROUND ART

Various electronic devices have experienced a development in a mounting technique, such as high integration of semiconductor devices to be mounted, high densification of wiring, and multilayer formation, with an increase in the amount of information processing. Besides, wiring boards for use in the various electronic devices are required to adapt to a high-frequency, like a millimeter-wave radar substrate for on-vehicle applications, for example. A reduction of a loss in a signal transmission is required for a wiring board for use in the various electronic devices to increase a transmission rate of a signal, and this is particularly required for a wiring board adapted to a high-frequency. In order to meet this requirement, a raw base material constituting a base material of a wiring board for use in the various electronic devices needs to have a low dielectric constant and a low dielectric loss tangent.

As an example of the raw base material, a PPE (polyphenylene ether)-containing resin composition which contains the PPE, a crosslinking curable compound, and a phosphaphenanthrene derivative was reported (Patent Literature 1).

On the other hand, a high thermal conductivity, as well as a low dielectric constant and a low dielectric loss tangent, is required for an electronic material for use in a substrate of PA (a power amplifier) in a base station, for example. So far, as a way of increasing the thermal conductivity in a resin composition, techniques using boron nitride as an inorganic filler having a high thermal conductivity was already reported (Patent Literatures 2 or 3).

Indeed, the boron nitride fillers disclosed in Patent Literatures 2 and 3 improve the thermal conductivity in the resin composition, but involve a problem that an increase in the amount of boron nitride to be added inevitably causes an increase in the moisture absorption of the resin composition. This is considered to be attributable to the fact that a boron nitride filler including a stable surface not reactable with a resin or a coupling agent causes, when added to a resin composition, the formation of voids of an invisible level between the resin and the filler. An increase in the moisture absorption of a substrate material is accompanied with drawbacks such as a decrease in the peel strength, a deterioration in electric properties, and an instability in the product quality depending on an environment (humidity). Additionally, depending on the amount of the filler contained, the moldability of the resin composition is also liable to be questionable.

CITATION LIST

Patent Literature

Patent Literature 1: JP 2015-67700A
Patent Literature 2: JP 2013-241321A
Patent Literature 3: JP 2014-208818A

SUMMARY OF INVENTION

The present invention is made in view of the circumstances described above, and the object thereof is to provide a resin composition from which a cured product having low dielectric characteristics, a high thermal conductivity, and a low moisture absorption is obtainable, the resin composition further exhibiting an excellent moldability. Another object of the present invention is to provide a prepreg, a film with a resin, a metal foil with a resin, a metal-clad laminate, and a wiring board which can be obtained by use of the resin composition.

As a result of various studies, the present inventors found that the object described above would be attainable by a configuration described hereinafter, and further studied to thereby achieve the present invention.

Specifically, a resin composition according to an aspect of the present invention includes: a polyphenylene ether compound having at least one of groups expressed by the following formulas (1) and (2); a curing agent reactable with the polyphenylene ether compound; a styrene-based polymer having structural units expressed by the following formulas (3) and (4); and an inorganic filler containing boron nitride, wherein a content of the inorganic filler is 100 to 320 parts by mass relative to 100 parts by mass of a total of the polyphenylene ether compound, the curing agent, and the styrene-based polymer.

[Chemical formula 1]

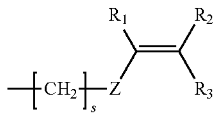

(1)

(In formula (1), s denotes an integer of 0 to 10. Z represents an arylene group. $R_1$ to $R_3$ each independently represents a hydrogen atom or an alkyl group.)

[Chemical formula 2]

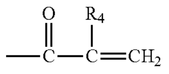

(2)

(In formula (2), $R_4$ represents a hydrogen atom or an alkyl group.)

[Chemical formula 3]

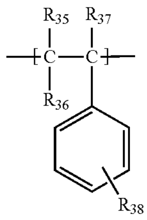

(3)

-continued

[Chemical formula 4]

(4)

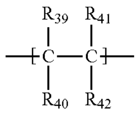

(In formula (3), $R_{35}$ to $R_{37}$ each independently represents a hydrogen atom or an alkyl group, and $R_{38}$ represents a hydrogen atom or an alkyl group. In formula (4), $R_{39}$ to $R_{42}$ each independently represents a hydrogen atom or an alkyl group, and when $R_{39}$ and Rao each independently represents an alkyl group, $R_{41}$ and $R_{42}$ each represents a hydrogen atom, and alternatively, when $R_{41}$ and $R_{42}$ each independently represents an alkyl group, $R_{39}$ and Rao each represents a hydrogen atom.)

DESCRIPTION OF EMBODIMENTS

Figure 1:
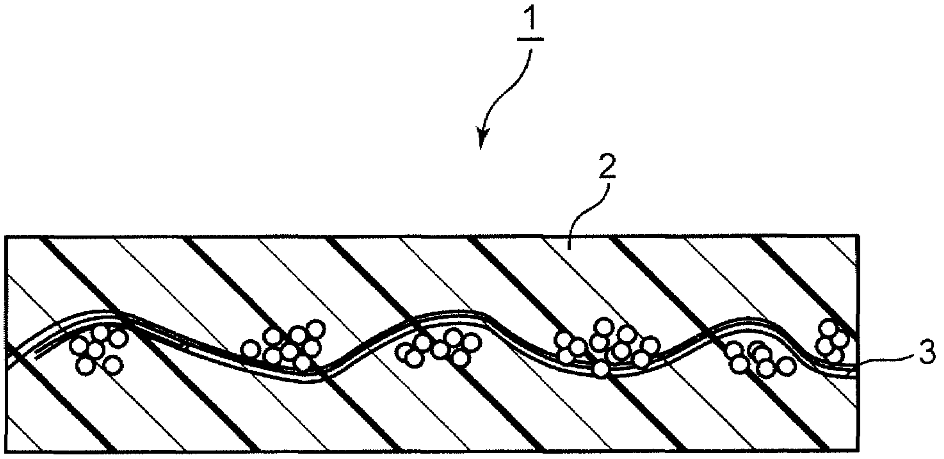
FIG. 1 is a schematic cross-sectional view showing an example of a prepreg according to an embodiment of the present invention.

The embodiments of the present invention will be specifically described below, but the present invention is not limited thereto.

Resin Composition

A resin composition according to an embodiment of the present invention includes a polyphenylene ether compound having at least one of groups expressed by the following formulas (1) and (2), a curing agent reactable with the polyphenylene ether compound, a styrene-based polymer having structural units expressed by the following formulas (3) and (4); and an inorganic filler containing boron nitride, wherein a content of the inorganic filler is 100 to 320 parts by mass relative to 100 parts by mass of a total of the polyphenylene ether compound, the curing agent, and the styrene-based polymer.

[Chemical formula 5]

(1)

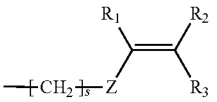

(In formula (1), s denotes an integer of 0 to 10. Z represents an arylene group. $R_1$ to $R_3$ each independently represents a hydrogen atom or an alkyl group.)

[Chemical formula 6]

(2)

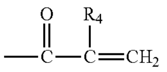

(In formula (2), $R_4$ represents a hydrogen atom or an alkyl group.)

[Chemical formula 7]

(3)

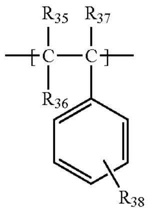

[Chemical formula 8]

(4)

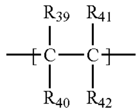

(In formula (3), $R_{35}$ to $R_{37}$ each independently represents a hydrogen atom or an alkyl group, and $R_{38}$ represents a hydrogen atom or an alkyl group. In formula (4), $R_{39}$ to $R_{42}$ each independently represents a hydrogen atom or an alkyl group, and when $R_{39}$ and $R_{40}$ each independently represents an alkyl group, $R_{41}$ and $R_{42}$ each represents a hydrogen atom, and alternatively, when $R_{41}$ and $R_{42}$ each independently represents an alkyl group, $R_{39}$ and $R_{40}$ each represents a hydrogen atom.)

The configuration makes it possible to provide a resin composition from which a cured product having low dielectric characteristics, a high thermal conductivity, and a low moisture absorption is obtainable, the resin composition further exhibiting an excellent moldability. This is considered to be because water hardly permeates the resin composition owing to the addition of the styrene-based polymer having high gas barrier properties, even though the resin composition contains boron nitride having a high thermal conductivity as an inorganic filler.

In other words, the present invention makes it possible to provide a resin composition from which a cured product having low dielectric characteristics, a high thermal conductivity, and being hardly susceptible to a variation in an external environment such as the humidity (i.e., exhibiting a low moisture absorption) is obtainable, the resin composition further exhibiting an excellent moldability. Further, according to the present invention, the resin composition can be used to provide a prepreg, a film with a resin, a metal foil with a resin, a metal-clad laminate, and a wiring board exhibiting an excellent performance.

First, each component of a resin composition according to the present embodiment will be described.

Polyphenylene Ether Compound

The polyphenylene ether compound according to the present embodiment is not particularly limited as long as it is a polyphenylene ether compound having a group expressed by the formula (1) or the formula (2) below. The low dielectric characteristics and the high heat resistance of a cured product obtainable from the resin composition are considered to be attributable to the modified polyphenylene ether compound contained in the resin composition.

[Chemical formula 9]

(1)

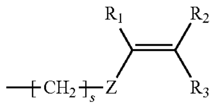

In formula (1), s denotes an integer of 0 to 10. Z represents an arylene group. $R_1$ to $R_3$ are independent of one another. In other words, $R_1$ to $R_3$ may be the same group or different groups from one another. $R_1$ to $R_3$ represent a hydrogen atom or an alkyl group.

When s denotes 0 in formula (1), this means that Z is directly bonded to a terminal end of the polyphenylene ether.

The arylene group of Z is not particularly limited. Examples of this arylene group include a monocyclic aromatic group such as a phenylene group and a polycyclic aromatic group in which the aromatic is not monocyclic but polycyclic aromatic such as a naphthalene ring. The arylene group also includes a derivative in which the hydrogen atom bonded to the aromatic ring is substituted with a functional group such as an alkenyl group, an alkynyl group, a formyl group, an alkylcarbonyl group, an alkenyl carbonyl group, or an alkynyl carbonyl group. The alkyl group is not particularly limited, and for example, an alkyl group having 1 to 18 carbon atoms is preferable, and an alkyl group having 1 to 10 carbon atoms is more preferable. Specific examples thereof include a methyl group, an ethyl group, a propyl group, a hexyl group, and a decyl group.

[Chemical formula 10]

(2)

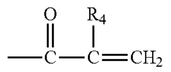

In formula (2), $R_4$ represents a hydrogen atom or an alkyl group. The alkyl group is not particularly limited, and for example, an alkyl group having 1 to 18 carbon atoms is preferable, and an alkyl group having 1 to 10 carbon atoms is more preferable. Specific examples thereof include a methyl group, an ethyl group, a propyl group, a hexyl group, and a decyl group.

Preferable specific examples of the substituent expressed by the formula (1) include, for example, a substituent containing a vinylbenzyl group. Examples of the substituent containing the vinylbenzyl group include a substituent expressed by the following formula (6). Examples of the substituent expressed by the formula (2) include an acrylate group and a methacrylate group.

[Chemical formula 11]

(6)

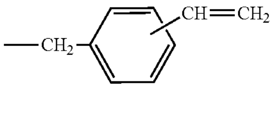

Specific examples of the substituent include a vinylbenzyl group (ethenylbenzyl group) such as p-ethenylbenzyl group and m-ethenylbenzyl group, a vinylphenyl group, an acrylate group, and a methacrylate group.

In the resin composition according to the present embodiment, the polyphenylene ether compound preferably has a group expressed by formula (2). Because this improves the reactivity with a crosslinking agent, and consequently has an advantage that the attainment of a cured resin product having a high heat resistance is facilitated.

The polyphenylene ether compound has a polyphenylene ether chain in the molecule and preferably has, for example, a repeating unit expressed by the following formula (7) in the molecule.

[Chemical formula 12]

(7)

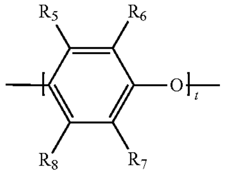

In formula (7), t denotes 1 to 50. $R_5$ to $R_8$ are independent of one another. In other words, $R_5$ to $R_8$ may be the same group or different groups from one another. $R_5$ to $R_8$ represent a hydrogen atom, an alkyl group, an alkenyl group, an alkynyl group, a formyl group, an alkylcarbonyl group, an alkenyl carbonyl group, or an alkynyl carbonyl group. Among these, a hydrogen atom and an alkyl group are preferable.

Specific examples of the respective functional groups mentioned in $R_5$ to $R_8$ are listed below.

The alkyl group is not particularly limited and is, for example, preferably an alkyl group having 1 to 18 carbon atoms, and more preferably an alkyl group having 1 to 10 carbon atoms. Specific examples thereof include a methyl group, an ethyl group, a propyl group, a hexyl group, and a decyl group.

The alkenyl group is not particularly limited and is, for example, preferably an alkenyl group having 2 to 18 carbon atoms, and more preferably an alkenyl group having 2 to 10 carbon atoms. Specific examples thereof include a vinyl group, an allyl group, and a 3-butenyl group.

The alkynyl group is not particularly limited and is, for example, preferably an alkynyl group having 2 to 18 carbon atoms, and more preferably an alkynyl group having 2 to 10 carbon atoms. Specific examples thereof include an ethynyl group and a prop-2-yn-1-yl group (propargyl group).

The alkylcarbonyl group is not particularly limited as long as the alkylcarbonyl group is a carbonyl group substituted with an alkyl group and is, for example, preferably an alkylcarbonyl group having 2 to 18 carbon atoms, and more preferably an alkylcarbonyl group having 2 to 10 carbon atoms. Specific examples thereof include an acetyl group, a propionyl group, a butyryl group, an isobutyryl group, a pivaloyl group, a hexanoyl group, an octanoyl group, and a cyclohexylcarbonyl group.

The alkenyl carbonyl group is not particularly limited as long as the alkenyl carbonyl group is a carbonyl group substituted with an alkenyl group and is, for example, preferably an alkenyl carbonyl group having 3 to 18 carbon atoms, and more preferably an alkenyl carbonyl group having 3 to 10 carbon atoms. Specific examples thereof include an acryloyl group, a methacryloyl group, and a crotonoyl group.

The alkynyl carbonyl group is not particularly limited as long as the alkynyl carbonyl group is a carbonyl group substituted with an alkynyl group and is, for example, preferably an alkynyl carbonyl group having 3 to 18 carbon atoms, and more preferably an alkynyl carbonyl group having 3 to 10 carbon atoms. Specific examples thereof include a propioloyl group.

The weight average molecular weight (Mw) and the number average molecular weight (Mn) of the polyphenylene ether compound are not particularly limited. Specifically, these are preferably 500 to 5,000, more preferably 800 to 4,000, and still more preferably 1,000 to 3,000. The weight average molecular weight and the number average molecular weight here may be measured by a general molecular weight measurement method, and specific examples thereof include a value measured by gel permeation chromatography (GPC). In a case where the polyphenylene ether compound has a repeating unit expressed by formula (11) in the molecule, t preferably denotes a numerical value so that the weight average molecular weight and the number average molecular weight of the polyphenylene ether compound fall within such a range. Specifically, t preferably denotes 1 to 50.

When the molecular weights of the polyphenylene ether compound are within such a range, the polyphenylene ether compound exhibits the excellent low dielectric characteristics of polyphenylene ether and not only imparts superior heat resistance to the cured product but also exhibits excellent moldability. This is considered to be attributed to the following reason. When the weight average molecular weight and the number average molecular weight of ordinary polyphenylene ether are within such a range, the heat resistance of the cured product tends to decrease since the molecular weights are relatively low. With regard to this point, it is considered that a cured product exhibiting sufficiently high heat resistance is obtained since the polyphenylene ether compound according to the present embodiment has more than one unsaturated double bond at the terminal end. When the molecular weights of the polyphenylene ether compound are within such a range, the polyphenylene ether compound has a relatively low molecular weight and is considered to be excellent in moldability as well. Hence, it is considered that such a polyphenylene ether compound is not only excellent in heat resistance of the cured product but also excellent in moldability.

In the polyphenylene ether compound, the average number of the substituents (number of terminal functional groups) at the terminal end of the molecule per one molecule of polyphenylene ether is not particularly limited. Specifically, the number is preferably 1 to 5, more preferably 1 to 3, and still more preferably 1.5 to 3. When this number of functional groups is too small, sufficient heat resistance of the cured product tends to be hardly attained. When the number of terminal functional groups is too large, the reactivity is too high and, for example, there is a possibility that troubles such as a decrease in storage stability of the resin composition and a decrease in fluidity of the resin composition may occur. In other words, when such polyphenylene ether compound is used, for example, there is a possibility that molding defects such as voids generated at the time of multilayer molding may occur by insufficient fluidity and the like and this may cause a moldability problem so that it is difficult to obtain a highly reliable printed wiring board.

The number of terminal functional groups in the polyphenylene ether compound includes a numerical value expressing the average value of the substituents per one molecule of all the modified polyphenylene ether compounds existing in 1 mole of the polyphenylene ether compound. This number of terminal functional groups can be determined, for example, by measuring the number of hydroxyl groups remaining in the obtained modified polyphenylene ether compound and calculating the number of hydroxyl groups decreased from the number of hydroxyl groups in the polyphenylene ether before being modified. The number of hydroxyl groups decreased from the number of hydroxyl groups in the polyphenylene ether before being modified is the number of terminal functional groups. With regard to the method for measuring the number of hydroxyl groups remaining in the modified polyphenylene ether compound, the number of hydroxyl groups can be determined by adding a quaternary ammonium salt (tetraethylammonium hydroxide) to be associated with a hydroxyl group to a solution of the modified polyphenylene ether compound and measuring the UV absorbance of the mixed solution.

The intrinsic viscosity of the polyphenylene ether compound in the present embodiment is not particularly limited. Specifically, the intrinsic viscosity may be 0.03 to 0.12 dl/g, but preferably 0.04 to 0.11 dl/g, and more preferably 0.06 to 0.095 dl/g. When the intrinsic viscosity is too low, the molecular weight tends to be low and low dielectric characteristics such as a low dielectric constant and a low dielectric loss tangent tend to be hardly attained. When the intrinsic viscosity is too high, the viscosity is high, sufficient fluidity is not attained, and the moldability of the cured product tends to decrease. Hence, if the intrinsic viscosity of the polyphenylene ether compound is within the above range, excellent heat resistance and moldability of the cured product can be realized.

The intrinsic viscosity here is an intrinsic viscosity measured in methylene chloride at 25° C. and more specifically is, for example, a value acquired by measuring the intrinsic viscosity of a methylene chloride solution (liquid temperature: 25° C.) at 0.18 g/45 ml using a viscometer. Examples of the viscometer include AVS500 Visco System manufactured by SCHOTT Instruments GmbH.

Examples of the polyphenylene ether compound according to the present embodiment include a modified polyphenylene ether compound expressed by the following formula (8) and a modified polyphenylene ether compound expressed by the following formula (9). As the polyphenylene ether compound according to the present embodiment, these modified polyphenylene ether compounds may be used singly or two kinds of these modified polyphenylene ether compounds may be used in combination.

[Chemical formula 13]

(8)

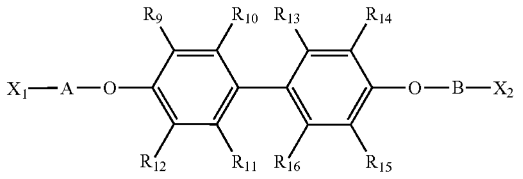

-continued

[Chemical formula 14]

(9)

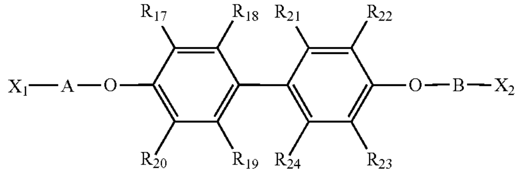

In the formulas (8) and (9), $R_9$ to $R_{16}$ and $R_{17}$ to $R_{24}$ each independently represents a hydrogen atom, an alkyl group, an alkenyl group, an alkynyl group, a formyl group, an alkylcarbonyl group, an alkenyl carbonyl group, or an alkynyl carbonyl group. $X_1$ and $X_2$ each independently represents a substituent having a carbon-carbon unsaturated double bond. A and B respectively represent repeating units expressed by the following formulas (10) and (11). In formula (9), Y represents a linear, branched, or cyclic hydrocarbon having 20 or less carbon atoms.

[Chemical formula 15]

(10)

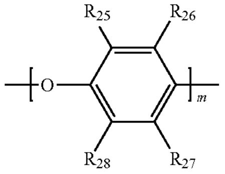

[Chemical formula 16]

(11)

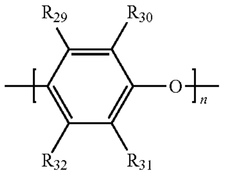

In formulas (10) and (11), m and n each denotes 0 to 20. $R_{25}$ to $R_{28}$ and $R_{29}$ to $R_{32}$ each independently represents a hydrogen atom, an alkyl group, an alkenyl group, an alkynyl group, a formyl group, an alkylcarbonyl group, an alkenyl carbonyl group, or an alkynyl carbonyl group.

The modified polyphenylene ether compound expressed by formula (8) and the modified polyphenylene ether compound expressed by formula (9) are not particularly limited as long as they are compounds satisfying the above configuration. Specifically, in formulas (8) and (9), $R_9$ to Rib and $R_{17}$ to $R_{24}$ are independent of one another as described above. In other words, $R_9$ to $R_{16}$ and $R_{17}$ to $R_{24}$ may be the same group or different groups from one another. $R_9$ to $R_{16}$ and $R_{17}$ to $R_{24}$ represent a hydrogen atom, an alkyl group, an alkenyl group, an alkynyl group, a formyl group, an alkylcarbonyl group, an alkenyl carbonyl group, or an alkynyl carbonyl group. Among these, a hydrogen atom and an alkyl group are preferable.

In formulas (10) and (11), m and n each preferably denotes 0 to 20 as described above. It is preferable that m and n denote numerical values so that the sum of m and n is 1 to 30. Hence, it is more preferable that m denotes 0 to 20, n denotes 0 to 20, and the sum of m and n is 1 to 30. $R_{25}$ to $R_{28}$ and $R_{29}$ to $R_{32}$ are independent of one another. In other words, $R_{25}$ to $R_{28}$ and $R_{29}$ to $R_{32}$ may be the same group or different groups from one another. $R_{25}$ to $R_{28}$ and $R_{29}$ to $R_{32}$ represent a hydrogen atom, an alkyl group, an alkenyl group, an alkynyl group, a formyl group, an alkylcarbonyl group, an alkenyl carbonyl group, or an alkynyl carbonyl group. Among these, a hydrogen atom and an alkyl group are preferable.

$R_9$ to $R_{32}$ are the same as $R_5$ to $R_8$ in the formula (7).

In formula (9), Y represents a linear, branched, or cyclic hydrocarbon having 20 or less carbon atoms as described above. Examples of Y include a group expressed by the following formula (12).

[Chemical formula 17]

(12)

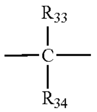

In formula (12), $R_{33}$ and $R_{34}$ each independently represents a hydrogen atom or an alkyl group. Examples of the alkyl group include a methyl group. Examples of the group expressed by formula (12) include a methylene group, a methylmethylene group, and a dimethylmethylene group. Among these, a dimethylmethylene group is preferable.

In formulas (8) and (9), $X_1$ and $X_2$ are each an independent substituent having a carbon-carbon unsaturated double bond. The substituents $X_1$ and $X_2$ are not particularly limited as long as the substituents $X_1$ and $X_2$ have a carbon-carbon unsaturated double bond. Examples of the substituents $X_1$ and $X_2$ include a substituent expressed by the formula (1) and a substituent expressed by the formula (2). In the modified polyphenylene ether compound expressed by formula (8) and the modified polyphenylene ether compound expressed by formula (9), $X_1$ and $X_2$ may be the same substituent or different substituents from each other.

More specific examples of the modified polyphenylene ether compound expressed by formula (8) include a modified polyphenylene ether compound expressed by the following formula (13).

[Chemical formula 18]

(13)

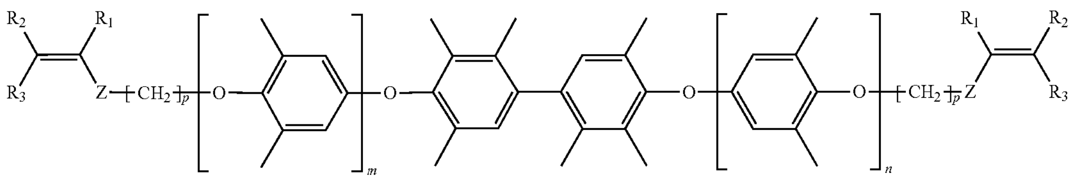

More specific examples of the modified polyphenylene ether compound expressed by formula (9) include a modified polyphenylene ether compound expressed by the following formula (14) and a modified polyphenylene ether compound expressed by the following formula (15).

[Chemical formula 19]

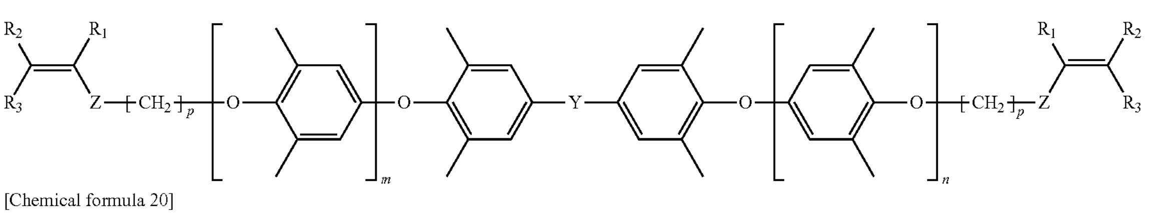

(14)

[Chemical formula 20]

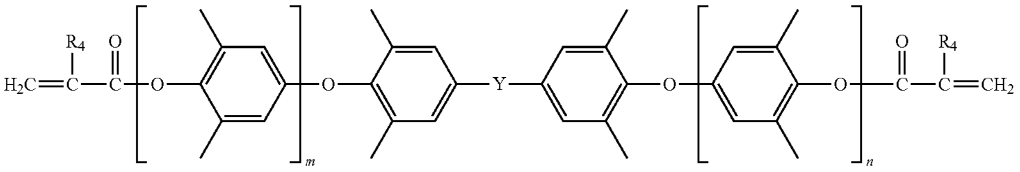

(15)

In the formulas (13) to (15), m and n are the same as m and n in the formulas (10) and (11). In the formulas (13) and (14), $R_1$ to $R_3$, p, and Z are the same as $R_1$ to $R_3$, s, and Z in the formula (1). In the formulas (14) and (15), Y is the same as Yin the above (9). In the formula (14), $R_4$ is the same as $R_4$ in the formula (2).

The method for synthesizing the polyphenylene ether compound used in the present embodiment is not particularly limited as long as a polyphenylene ether compound of which the terminal end is modified with a group expressed by the formula (1) and/or the formula (2) can be synthesized. Specific examples thereof include a method in which polyphenylene ether is reacted with a compound in which a substituent having a carbon-carbon unsaturated double bond is bonded to a halogen atom.

Examples of the compound in which a substituent having a carbon-carbon unsaturated double bond is bonded to a halogen atom include compounds in which substituents expressed by the formulas (1), (2), and (6) are bonded to a halogen atom. Specific examples of the halogen atom include a chlorine atom, a bromine atom, an iodine atom, and a fluorine atom. Among these, a chlorine atom is preferable. More specific examples of the compound in which a substituent having a carbon-carbon unsaturated double bond is bonded to a halogen atom include p-chloromethylstyrene and m-chloromethylstyrene.

Polyphenylene ether which is a raw material is not particularly limited as long as a predetermined modified polyphenylene ether compound can be finally synthesized. Specific examples thereof include those containing polyphenylene ether composed of 2,6-dimethylphenol and at least one of a bifunctional phenol and a trifunctional phenol and polyphenylene ether such as poly(2,6-dimethyl-1,4-phenylene oxide) as a main component. The bifunctional phenol is a phenol compound having two phenolic hydroxyl groups in the molecule, and examples thereof include tetramethyl bisphenol A. The trifunctional phenol is a phenol compound having three phenolic hydroxyl groups in the molecule.

Examples of the method for synthesizing the polyphenylene ether compound according to the present embodiment include the methods described above. Specifically, polyphenylene ether as described above and a compound in which a substituent having a carbon-carbon unsaturated double bond is bonded to a halogen atom are dissolved in a solvent and stirred. This causes the polyphenylene ether to react with the compound in which a substituent having a carbon-carbon unsaturated double bond is bonded to a halogen atom, and the polyphenylene ether compound used in the present embodiment is obtained.

The reaction is preferably conducted in the presence of an alkali metal hydroxide. The reaction is considered to proceed suitably in this way. This is considered to be attributable to the fact that the alkali metal hydroxide functions as a dehydrohalogenating agent, specifically, a dehydrochlorinating agent. In other words, it is considered that the alkali metal hydroxide eliminates the hydrogen halide from the phenol group in polyphenylene ether and the compound in which a substituent having a carbon-carbon unsaturated double bond is bonded to a halogen atom, and consequently, the substituent having a carbon-carbon unsaturated double bond is bonded to the oxygen atom of the phenol group instead of the hydrogen atom of the phenol group in the polyphenylene ether.

The alkali metal hydroxide is not particularly limited as long as the alkali metal hydroxide can act as a dehalogenating agent, and examples thereof include sodium hydroxide. The alkali metal hydroxide is usually used in the form of an aqueous solution and is specifically used as an aqueous sodium hydroxide solution.

The reaction conditions such as reaction time and reaction temperature also vary depending on the compound in which a substituent having a carbon-carbon unsaturated double bond is bonded to a halogen atom and the like, and are not particularly limited as long as they are conditions under which the reaction as described above suitably proceeds. Specifically, the reaction temperature is preferably room temperature to 100° C., more preferably 30° C. to 100° C. The reaction time is preferably 0.5 to 20 hours, more preferably 0.5 to 10 hours.

The solvent used at the time of the reaction is not particularly limited as long as the solvent can dissolve polyphenylene ether and the compound in which a substituent having a carbon-carbon unsaturated double bond is bonded to a halogen atom, and does not inhibit the reaction of polyphenylene ether with the compound in which a substituent having a carbon-carbon unsaturated double bond is bonded to a halogen atom. Specific examples thereof include toluene.

The above reaction is preferably conducted in the presence of not only an alkali metal hydroxide but also a phase transfer catalyst. In other words, the above reaction is preferably conducted in the presence of an alkali metal hydroxide and a phase transfer catalyst. It is considered that the reaction proceeds suitably in this way. This is considered to be attributed to the following reason. This is considered to be because the phase transfer catalyst is a catalyst which has a function of taking in the alkali metal hydroxide, is soluble in both of a phase of a polar solvent such as water and a phase of a non-polar solvent such as an organic solvent, and can transfer between these phases. Specifically, in a case where an aqueous sodium hydroxide solution is used as an alkali metal hydroxide and an organic solvent, such as toluene, which is incompatible with water is used as a solvent, it is considered that even when the aqueous sodium hydroxide solution is dropped into the solvent subjected to the reaction, the solvent and the aqueous sodium hydroxide solution are separated from each other and the sodium hydroxide is hardly transferred to the solvent. In that case, it is considered that the aqueous sodium hydroxide solution added as an alkali metal hydroxide hardly contributes to the promotion of the reaction. In contrast, when the reaction is conducted in the presence of an alkali metal hydroxide and a phase transfer catalyst, it is considered that the alkali metal hydroxide is transferred to the solvent in the state of being taken in the phase transfer catalyst and the aqueous sodium hydroxide solution is likely to contribute to the promotion of the reaction. For this reason, when the reaction is conducted in the presence of an alkali metal hydroxide and a phase transfer catalyst, it is considered that the above reaction more suitably proceeds.

The phase transfer catalyst is not particularly limited, and examples thereof include quaternary ammonium salts such as tetra-n-butylammonium bromide.

The resin composition used in the present embodiment preferably contains a modified polyphenylene ether compound obtained as described above as the polyphenylene ether compound.

Curing Agent

The resin composition according to the present embodiment further contains a curing agent reactable with the polyphenylene ether compound.

The curing agent is not particularly limited as long as the curing agent can cure the resin composition containing the polyphenylene ether compound by reacting with the polyphenylene ether compound. Examples of the curing agent include a curing agent having at least one functional group which contributes to the reaction with the polyphenylene ether compound in the molecule.

Specific examples thereof include a compound having two or more unsaturated double bonds in a molecule. More specifically, examples include styrene derivatives, a compound having an acryloyl group in the molecule, and a compound having a methacryloyl group in the molecule, a compound having a vinyl group in the molecule, a compound having an allyl group in the molecule, a compound having a maleimide group in the molecule, a compound having an acenaphthylene structure in the molecule, and an isocyanurate compound having an isocyanurate group in the molecule.

Examples of the styrene derivatives include bromostyrene and dibromostyrene.

The compound having an acryloyl group in the molecule is an acrylate compound. Examples of the acrylate compound include a monofunctional acrylate compound having one acryloyl group in the molecule and a polyfunctional acrylate compound having two or more acryloyl groups in the molecule. Examples of the monofunctional acrylate compound include methyl acrylate, ethyl acrylate, propyl acrylate, and butyl acrylate. Examples of the polyfunctional acrylate compound include tricyclodecanedimethanol diacrylate.

A compound having a methacryloyl group in the molecule is a methacrylate compound. Examples of the methacrylate compound include a monofunctional methacrylate compound having one methacryloyl group in the molecule, and a polyfunctional methacrylate compound having two or more methacryloyl groups in the molecule. Examples of the monofunctional methacrylate compound include methyl methacrylate, ethyl methacrylate, propyl methacrylate, and butyl methacrylate. Examples of the polyfunctional methacrylate compound include tricyclodecane dimethanol dimethacrylate.

The compound having a vinyl group in the molecule is a vinyl compound. Examples of the vinyl compound include a monofunctional vinyl compound (monovinyl compound) having one vinyl group in the molecule and a polyfunctional vinyl compound having two or more vinyl groups in the molecule. Examples of the polyfunctional vinyl compound include divinylbenzene and polybutadiene.

The compound having an allyl group in the molecule is an allyl compound. Examples of the allyl compound include a monofunctional allyl compound having one allyl group in the molecule and a polyfunctional allyl compound having two or more allyl groups in the molecule. Examples of the polyfunctional allyl compound include diallyl phthalate (DAP).

The compound having a maleimide group in the molecule is a maleimide compound. Examples of the maleimide compound include a monofunctional maleimide compound having one maleimide group in the molecule, a polyfunctional maleimide compound having two or more maleimide groups in the molecule, and a modified maleimide compound. Examples of the modified maleimide compound include a modified maleimide compound in which a part of the molecule is modified with an amine compound, a modified maleimide compound in which a part of the molecule is modified with a silicone compound, and a modified maleimide compound in which a part of the molecule is modified with an amine compound and a silicone compound.

A compound having an acenaphthylene structure in the molecule is an acenaphthylene compound. Examples of the acenaphthylene compound include acenaphthylene, alkylacenaphthylenes, halogenated acenaphthylenes, and phenylacenaphthylenes. Examples of the alkylacenaphthylenes include 1-methylacenaphthylene, 3-methylacenaphthylene, 4-methylacenaphthylene, 5-methylacenaphthylene, 1-ethylacenaphthylene, 3-ethylacenaphthylene, 4-ethylacenaphthylene, and 5-ethylacenaphthylene Examples of the halogenated acenaphthylenes include 1-chloroacenaphthylene, 3-chloroacenaphthylene, 4-chloroacenaphthylene, 5-chloroacenaphthylene, 1-bromoacenaphthy lene, 3-bromoacenaphthylene, 4-bromoacenaphthylene, and 5-bromoacenaphthylene. Examples of the phenylacenaphthylenes include 1-phenylacenaphthylene, 3-phenylacenaphthylene, 4-phenylacenaphthylene, and 5-phenylacenaphthylene. The acenaphthylene compound may be a monofunctional acenaphthylene compound having one acenaphthylene structure in the molecule, or a polyfunctional acenaphthylene compound having two or more acenaphthylene structures in the molecule.

A compound having an isocyanurate group in the molecule is an isocyanurate compound. The isocyanurate compound may be a compound further containing an alkenyl group in the molecule (alkenyl isocyanurate compound), and examples thereof include a trialkenyl isocyanurate compound such as triallyl isocyanurate (TRIC).

Among these, preferable examples of the curing agent used in the present embodiment include a polyfunctional acrylate compound having two or more acryloyl groups in the molecule, a polyfunctional methacrylate compound having two or more methacryloyl groups in the molecule, a polyfunctional vinyl compound having two or more vinyl groups in the molecule, a styrene derivative, an allyl compound having an allyl group in the molecule, a maleimide compound having a maleimide group in the molecule, an acenaphthylene compound having an acenaphthylene structure in the molecule, and an isocyanurate compound having an isocyanurate group in the molecule.

The curing agent may be used singly or in combination of two or more kinds thereof.

The curing agent preferably has a weight average molecular weight of 100 to 5,000, more preferably 100 to 4,000, and still more preferably 100 to 3,000. When the weight average molecular weight of the curing agent is too low, the curing agent may easily volatilize from the compounding component system of the resin composition. When the weight average molecular weight of the curing agent is too high, the viscosity of the varnish of the resin composition and the melt viscosity at the time of heat molding may be too high. Hence, a resin composition imparting superior heat resistance to the cured product is obtained when the weight average molecular weight of the curing agent is within such a range. This is considered to be because the resin composition containing the polyphenylene ether compound can be suitably cured by a reaction with the polyphenylene ether compound. The weight average molecular weight here may be measured by a general molecular weight measurement method, and specific examples thereof include a value measured by gel permeation chromatography (GPC).

The average number (number of functional groups) of the functional groups which contribute to the reaction of the curing agent with the polyphenylene ether compound per one molecule of the curing agent varies depending on the weight average molecular weight of the curing agent but is, for example, preferably 1 to 20, and more preferably 2 to 18. When this number of functional groups is too small, sufficient heat resistance of the cured product tends to be hardly attained. When the number of functional groups is too large, the reactivity is too high and, for example, troubles such as a decrease in the storage stability of the resin composition or a decrease in the fluidity of the resin composition may occur.

Styrene-Based Polymer

The styrene-based polymer used in the present embodiment has structural units expressed by the following formulas (3) and (4).

[Chemical formula 21]

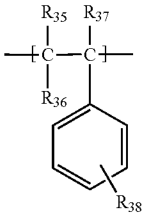

(3)

[Chemical formula 22]

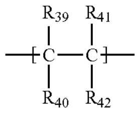

(4)

In formula (3), $R_{35}$ to $R_{37}$ each independently represents a hydrogen atom or an alkyl group, and $R_{38}$ represents a hydrogen atom or an alkyl group. The alkyl group is not particularly limited, and for example, an alkyl group having 1 to 18 carbon atoms is preferable, and an alkyl group having 1 to 10 carbon atoms is more preferable. Specific examples thereof include a methyl group, an ethyl group, a propyl group, a hexyl group, and a decyl group. The styrene-based polymer according to the present embodiment includes at least one kind of structural unit expressed by the formula (3), but may include two or more different kinds thereof in combination. Further, it is preferable to include a structure where the structural unit expressed by the formula (3) is repeated.

In formula (4), $R_{39}$ to $R_{42}$ each independently represents a hydrogen atom or an alkyl group, and when $R_{39}$ and $R_{40}$ each independently represents an alkyl group, $R_{41}$ and $R_{42}$ each represents a hydrogen atom, and alternatively, when $R_{41}$ and $R_{42}$ each independently represents an alkyl group, $R_{39}$ and $R_{40}$ each represents a hydrogen atom. The alkyl group is not particularly limited, and for example, an alkyl group having 1 to 18 carbon atoms is preferable, and an alkyl group having 1 to 10 carbon atoms is more preferable. Specific examples thereof include a methyl group, an ethyl group, a propyl group, a hexyl group, and a decyl group. The styrene-based polymer according to the present embodiment includes at least one kind of structural unit expressed by the formula (4), but may include two or more different kinds thereof in combination. Further, it may include a structure where the structural unit expressed by the formula (4) is repeated.

In the styrene-based polymer, the structural units expressed by the formula (3) are preferably substantially 5 to 50 mol % of the entire polymer. This has an advantage that the compatibility with the resin can be ensured. These are more preferably 10 to 40 mol % of the entire polymer. This has an advantage that sufficient gas barrier properties can be ensured in the resin composition, in addition to that the compatibility with the resin can be ensured. The polymer morphology of the styrene-based polymer is not particularly limited, and may include a block copolymer, an alternating copolymer, a random copolymer, and a graft copolymer, where the block copolymer is preferable. Besides, the polymer may be in the form of a liquid, a solid, or an elastomer.

The weight average molecular weight and the number average molecular weight of the styrene-based polymer according to the present embodiment are not particularly limited, but are preferably substantially 10,000 to 200,000. In terms of the resin fluidity, the average molecular weights are preferably 50,000 to 150,000, and more preferably 20,000 to 100,000. When the weight average molecular weight and the number average molecular weight fall within the above range, there is an advantage that a proper resin fluidity can be secured in a cured resin product at the B-stage. The weight average molecular weight and the number average molecular weight here may be measured by a general molecular weight measurement method, and specific examples thereof include a value measured by gel permeation chromatography.

Further, at least a part of the structural units which are included in the styrene-based polymer according to the present embodiment and are expressed by the formula (4) preferably includes a structural unit expressed by the following formula (5). Further, it preferably includes a structure where the structural unit expressed by the formula (5) is repeated.

[Chemical formula 23]

(5)

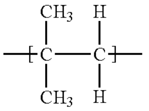

In the preferred embodiment, the styrene-based polymer desirably includes a styrene-isobutylene-styrene block copolymer (SIBS) having a structural unit expressed by the following formula (16). This enables an obtainment of a resin composition having high gas barrier properties, which brings an advantage that the moisture absorption can be suppressed in the resin composition.

[Chemical formula 24]

(16)

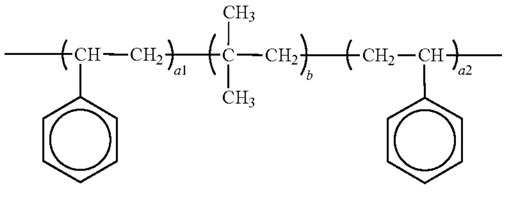

In formula (16), the sum of a1 and a2 is an integer of 1,000 to 60,000, b denotes an integer of 1,000 to 70,000, and the sum of a1, a2, and b is 10,000 to 130, 000.

A method for preparing a styrene-based polymer according to the present embodiment is not particularly limited, but an exemplary method for preparing the SIBS will be described. It can be synthesized by first polymerizing isobutylene according to Living cationic polymerization method, and thereafter still polymerizing by adding the styrene thereto.

As the styrene-based polymer according to the present embodiment, a commercially-available one can be also used, and examples thereof include "SIBSTAR (registered trademark) 073T", "SIBSTAR (registered trademark) 103T", and "SIBSTAR (registered trademark) 102T" manufactured by Kaneka Corporation.

Inorganic Filler

The resin composition according to the present embodiment further includes an inorganic filler containing boron nitride. The boron nitride is not particularly limited as long as the boron nitride can be used as an inorganic filler to be included in the resin composition. Examples of the boron nitride include a hexagonal boron nitride in a normal pressure phase (h-BN) and a cubic boron nitride in a high-pressure phase (c-BN).

The average particle diameter of the boron nitride according to the present embodiment is preferably 0.5 to 20 μm, and more preferably 2 to 18 μm. When the boron nitride is too small, the thermal conductivity and the heat resistance of a cured product of the obtained resin composition is liable to be hardly enhanced enough. When the boron nitride is too large, the moldability of the obtained resin composition is liable to decrease. Therefore, when the average particle diameter of the boron nitride is within the range described above, a resin composition which becomes a cured product having a high thermal conductivity and a high heat resistance can be more suitably obtained. Here, the average particle diameter indicates a volume average particle diameter. The volume average particle diameter can be measured, for example, by a laser diffraction method. As the boron nitride according to the present embodiment, two or more types of boron nitride fillers having different average particle diameters therebetween may be used together among boron nitride fillers falling within the range mentioned above.

The resin composition according to the present embodiment may include an inorganic filler other than the boron nitride. The inorganic filler other than the boron nitride is not particularly limited as long as it can be used as an inorganic filler contained in a resin composition. Specific examples of the inorganic filler other than the boron nitride include silica, alumina, titanium oxide, metal oxide such as magnesium oxide and mica, metal hydroxides such as aluminum hydroxide and magnesium hydroxide, talc, aluminum borate, barium sulfate, aluminum nitride, silicon nitride, magnesium carbonate such as anhydrous magnesium carbonate, and calcium carbonate. Among these, the silica, the anhydrous magnesium carbonate, the alumina, and the silicon nitride are preferable as an inorganic filler other than the boron nitride. The silica is not particularly limited, and examples thereof include fractured silica and granular silica, where the granular silica is preferable. The magnesium carbonate is not particularly limited, but the anhydrous magnesium carbonate (synthetic magnesite) is preferable.

The inorganic filler other than the boron nitride may be either a surface treated inorganic filler or a non-surface treated inorganic filler. Examples of the surface treatment include a treatment with a silane coupling agent.

Examples of the silane coupling agent include a silane coupling agent having at least one functional group selected from a group consisting of a vinyl group, a styryl group, a methacryloyl group, an acryloyl group, and a phenylamino group. Specifically, examples of the silane coupling agent include a compound having at least one of the vinyl group, the styryl group, the methacryloyl group, the acryloyl group, and the phenylamino group as a reactive functional group, and further having a hydrolyzable group such as a methoxy group or an ethoxy group.

Examples of the silane coupling agent include vinyltriethoxysilane and vinyltrimethoxysilane as the silane coupling agent having the vinyl group. Examples of the silane coupling agent include p-styryltrimethoxysilane and p-styryltriethoxysilane as the silane coupling agent having the styryl group. Examples of the silane coupling agent include 3-methacryloxypropyltrimethoxysilane, 3-methacryloxypropylmethyldimethoxysilane, 3-methacryloxypropyltriethoxysilane, 3-methacryloxypropylmethyldiethoxysilane, and 3-methacryloxypropylethyldiethoxysilane as the silane coupling agent having the methacryloyl group. Examples of the silane coupling agent include 3-acryloxypropyltrimethoxysilane and 3-acryloxypropyltriethoxysilane as the silane coupling agent having the acryloyl group. Examples of the silane coupling agent include n-phenyl-3-aminopropyltrimethoxysilane and n-phenyl-3-aminopropyltriethoxysilane as the silane coupling agent having the phenylamino group.

The average particle diameter of the inorganic filler other than the boron nitride is preferably 0.5 to 10 μm, and more preferably 0.5 to 8 μm. When the inorganic filler other than the boron nitride is too small, the heat resistance of a cured product of the obtained resin composition is liable to be hardly enhanced enough. Also, when the inorganic filler other than the boron nitride is too large, the heat resistance of a cured product of the obtained resin composition is liable to be hardly enhanced enough. This is considered to be attributable to the following reason. First, it is considered that a difference in size between the inorganic filler other than the boron nitride and the boron nitride becomes smaller, and consequently, the inorganic filler other than the boron nitride is more hardly present among the boron nitrides. Therefore, presumably, the effect of enhancing the heat resistance given by the inorganic filler other than the boron nitride owing to its presence among the boron nitrides is not sufficiently attainable. Accordingly, when the average particle diameter of the inorganic filler other than the boron nitride is within the range described above, a resin composition which becomes a cured product having a high thermal conductivity and a high heat resistance is more suitably obtainable. Here, the average particle diameter indicates a volume average particle diameter. The volume average particle diameter can be measured, for example, by a laser diffraction method.

The content of the inorganic filler in the resin composition according to the present embodiment is 100 to 320 parts by mass relative to 100 parts by mass of a total of the polyphenylene ether compound, the curing agent, and the styrene-based polymer. The content is preferably 100 to 270 parts by mass, and more preferably 100 to 220 parts by mass. When the content is less than 100 parts by mass, a sufficient thermal conductivity is hardly obtainable. On the other hand, when the content is more than 320 parts by mass, the moldability decreases. In other words, when the content of the inorganic filler is within the above range, it is possible to provide a resin composition from which a cured product having a high thermal conductivity is obtainable, the resin composition further having an excellent moldability.

When the inorganic filler according to the present embodiment includes an inorganic filler other than the boron nitride, the boron nitride and the inorganic filler other than the boron nitride are substantially contained preferably at mass ratios (of boron nitride to inorganic filler other than boron nitride) ranging from 1:4 to 7:1, and more preferably at mass ratios ranging from 1:2 to 3:1. When the inorganic filler other than boron nitride is silica, the silica and the boron nitride are contained preferably at mass ratios (of silica to boron nitride) ranging from 80:20 to 20:80, and more preferably at mass ratios ranging from 75:25 to 25:75.

Content of Each Component

The content of the polyphenylene ether compound in the resin composition according to the present embodiment is preferably 50 to 90 parts by mass, more preferably 50 to 80 parts by mass, and still more preferably 50 to 70 parts by mass relative to 100 parts by mass of the total of the polyphenylene ether compound, the curing agent, and the styrene-based polymer. In other words, the content of the polyphenylene ether compound is preferably 50 to 90 mass % of the components of the resin composition other than the inorganic filler. It is considered that a resin composition, from which a cured product having low dielectric characteristics and a high heat resistance is obtainable, can be more reliably attained when the content of the polyphenylene ether compound is within the above range.

The content of the curing agent is preferably 5 to 30 parts by mass, and more preferably 15 to 30 parts by mass relative to 100 by mass of the total of the polyphenylene ether compound, the curing agent, and the styrene-based polymer in the resin composition. When the content of the curing agent falls within the above range, the resulting resin composition can become a cured product having more excellent heat resistance. This is considered to be because the curing reaction between the resin component and the curing agent according to the present embodiment suitably proceeds.

The content of the styrene-based polymer is preferably 5 to 25 parts by mass, and more preferably 10 to 20 parts by mass relative to 100 parts by mass of the total of the polyphenylene ether compound, the curing agent, and the styrene-based polymer in the resin composition. It is considered that the moisture absorption can be suppressed in the resin composition, and the degradation of the electric properties due to an increase in the moisture absorption can be more reliably prevented when the content of the styrene-based polymer is within the above range.

Other Component

The resin composition according to the present embodiment may contain a component (another component) other than the components described above without impairing the effect of the present invention, if necessary. Examples of such a component contained in the resin composition according to the present embodiment may further include an additive, such as a reaction initiator, a silane coupling agent, a flame retardant, a defoaming agent, an antioxidant, a thermal stabilizer, an antistatic agent, an ultraviolet absorber, a dye, a pigment, a dispersant, and a lubricant. The resin composition according to the present embodiment may contain another thermosetting resin, such as an epoxy resin, a maleimide resin, an aromatic hydrocarbon resin, and an aliphatic hydrocarbon resin other than the polyphenylene ether compound, the curing agent, and the polymer.

As described above, the resin composition according to the present embodiment may contain a reaction initiator (initiator). The curing reaction can proceed even when the resin composition contains the polyphenylene ether compound, the curing agent, and the polymer. However, a reaction initiator may be added since there is a case where it is difficult to raise the temperature until curing proceeds depending on the process conditions.

The reaction initiator is not particularly limited as long as the reaction initiator can promote the curing reaction in the resin composition. Specific examples thereof include a metal oxide, an azo compound, and an organic peroxide.

Specific examples of the metal oxide include metal carboxylate.

Specific examples of the organic peroxide include α,α'-di(t-butylperoxy)diisopropylbenzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile.

Specific examples of the azo compound include 2,2'-azobis(2,4,4-trimethylpentane), 2,2'-azobis(n-butyl-2-methylpropionamide), 2,2'-azobis(2-methylbutyronitrile).

Among these, 2,2'-azobis(2,4,4-trimethylpentane), 2,2'-azobis(n-butyl-2-methylpropionamide) are the preferable reaction initiators. These reaction initiators barely affect the dielectric characteristics. Additionally, these have relatively high reaction initiation temperatures, and thus have advantages that the promotion of the curing reaction can be suppressed at the time point at which curing is not required, for example, at the time of prepreg drying, and that a decrease in the storage stability of the resin composition can be suppressed.

The reaction initiators described above may be used singly or in combination of two or more kinds thereof.

When the resin composition according to the present embodiment contains the reaction initiator, the content thereof is not particularly limited, and is, for example, preferably 0.5 to 2.0 parts by mass, more preferably 0.8 to 1.5 parts by mass, and still more preferably 0.9 to 1.0 parts by mass relative to 100 parts by mass of a total of the polyphenylene ether compound, the curing agent, and the styrene-based polymer.

Production Method

The production method of the resin composition is not particularly limited, but examples thereof include a method including mixing the polyphenylene ether compound, the curing agent, the styrene-based polymer, and other components as needed, and thereafter, adding an inorganic filler thereto. Specific examples of the case of obtaining a varnish-like composition containing an organic solvent include a method specified in the following description of the prepreg.

Further, a prepreg, a metal-clad laminate, a wiring board, a metal foil with a resin, a film with a resin are obtainable as described below by use of the resin composition according to the present embodiment.

A cured product of the resin composition preferably has a thermal conductivity of 1.0 W/m·K or more, and a dielectric loss tangent at a frequency of 10 GHz of 0.003 or less. As described above, the use of the resin composition according to the present embodiment enables a concurrent attainment of a high thermal conductivity and low dielectric characteristics in a cured product thereof. In the cured product, the moisture absorption can be also suppressed, which brings an excellent advantage that the cured product is hardly susceptible to a variation in an external environment such as the humidity. Additionally, the resin composition according to the present embodiment exhibits an excellent moldability.

Prepreg

FIG. 1 is a schematic cross-sectional view showing an example of a prepreg 1 according to an embodiment of the present invention. In the description hereinafter, reference numerals respectively indicate: a prepreg 1, a resin composition 2 or a semi-cured product of the resin composition, a fibrous base material 3, a metal-clad laminate 11, an insulating layer 12, a metal foil 13, wiring 14, a wiring board 21, a metal foil with a resin 31, a resin layer 32, 42, a film with a resin 41, and a support film 43.

As shown in FIG. 1, the prepreg 1 according to the present embodiment includes the resin composition 2 or a semi-cured product of the resin composition and the fibrous base material 3. The prepreg 1 includes the resin composition 2 or the semi-cured product of the resin composition, and the fibrous base material 3 which is present in the resin composition 2 or the semi-cured product of the resin composition.

In the present embodiment, the semi-cured product is in a state in which the resin composition is cured to such a degree as to be further curable. Specifically, the semi-cured product is in a state in which the resin composition is semi-cured (B-staged). For example, when a resin composition is heated, first, the viscosity of the resin composition gradually decreases, and thereafter, curing begins, and the viscosity gradually increases. In this case, the semi-curing state covers a state from the beginning of the increase in the viscosity until a stage before the completion of the curing.

The prepreg obtained by use of the resin composition according to the present embodiment may include a semi-cured product of the resin composition as described above, or may include an uncured resin composition itself. Specifically, the prepreg may include a semi-cured product of the resin composition (the B-stage resin composition) and a fibrous base material, or include the resin composition to be cured (the A-stage resin composition) and a fibrous base material. The resin composition or the semi-cured product of the resin composition may be obtained by drying, or heating and drying the resin composition.

When manufacturing a prepreg, the resin composition 2 is often prepared in a varnish form, and then used to impregnate the fibrous base material 3 being a base material constituting the prepreg. In other words, generally, the resin composition 2 is often a resin varnish prepared in the form of a varnish. The varnish-like resin composition (resin varnish) is prepared, for example, as follows.

First, components of the resin composition which are dissolvable in an organic solvent are introduced in the organic solvent to be thereby dissolved. At this time, heating may be performed if necessary. Thereafter, components which are used as needed and are not dissolvable in the organic solvent (e.g., an inorganic filler) are added thereto to be thereby dispersed until reaching a predetermined dispersion state using a ball mill, a bead mill, a planetary mixer, a roll mill or the like. A varnish-like resin composition is thus prepared. The organic solvent used here is not particularly limited as long as the organic solvent dissolves the modified polyphenylene ether compound, the curing agent, and the like, and does not inhibit the curing reaction. Specific examples thereof include toluene and methyl ethyl ketone (MEK).

The method for manufacturing the prepreg is not particularly limited as long as the prepreg can be manufactured. Specifically, when manufacturing a prepreg, the resin composition which is described above and is used in the present embodiment is often prepared in a varnish form and used as a resin varnish as described above.

Specific examples of the fibrous base material include a glass cloth, an aramid cloth, a polyester cloth, a nonwoven glass fabric, a nonwoven aramid fabric, a nonwoven polyester fabric, pulp paper, and linter paper. When a glass cloth is used, a laminate having an excellent mechanical strength can be obtained, where a glass cloth having undergone a flattening process is particularly preferable. Examples of the flattening process include a process of continuously pressurizing the glass cloth at an appropriate pressure by using a press roll to thereby compress the yarn to be flat. A commonly used thickness of the fibrous base material is, for example, 0.01 mm or more and 0.3 mm or less.

The method for manufacturing the prepreg is not particularly limited as long as the prepreg can be manufactured. Specifically, when manufacturing a prepreg, the resin composition which is described above and is according to the present embodiment is often prepared in a varnish form and used as a resin varnish as described above.

Examples of the method for manufacturing the prepreg 1 include a method in which the fibrous base material 3 is impregnated with the resin composition 2, for example, the resin composition 2 prepared in a varnish form, and then dried. The fibrous base material 3 is impregnated with the resin composition 2 by dipping, coating, and the like. If necessary, the impregnation can be repeated a plurality of times. Moreover, at this time, it is also possible to finally adjust the composition and impregnated amount to the desired composition and impregnated amount by repeating impregnation using a plurality of resin compositions having different compositions and concentrations.

The fibrous base material 3 impregnated with the resin composition (resin varnish) 2 is heated under desired heating conditions, for example, at 80° C. or more and 180° C. or less for 1 minute or more and 10 minutes or less. By heating, the prepreg 1 to be cured (A-stage) or in a semi-cured state (B-stage) is obtained. The heating can volatize the organic solvent from the resin varnish, and the organic solvent can be thus decreased or removed.

From a prepreg including the resin composition according to the present embodiment or a semi-cured product of the resin composition, a cured product having low dielectric characteristics, a high thermal conductivity, and being hardly susceptible to a variation in an external environment such as the humidity (i.e., exhibiting a low moisture absorption) can be suitably obtained. Further, the prepreg according to the present embodiment is excellent in the moldability as well.

Metal-Clad Laminate

Figure 2:
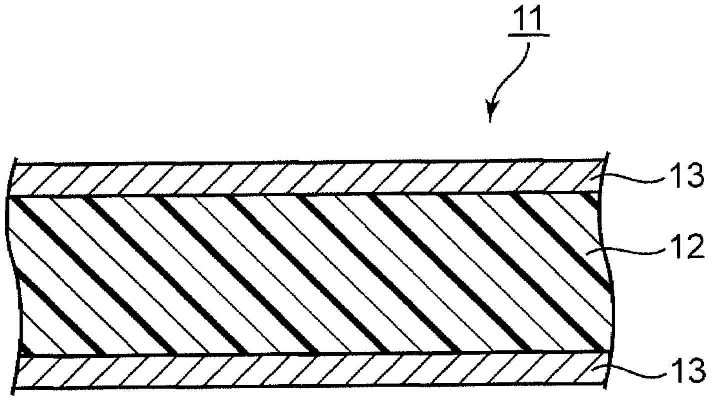
FIG. 2 is a schematic cross-sectional view showing an example of a metal-clad laminate according to an embodiment of the present invention.

FIG. 2 is a schematic cross-sectional view showing an example of the metal-clad laminate 11 according to an embodiment of the present invention.

As shown in FIG. 2, a metal-clad laminate 11 includes an insulating layer 12 containing a cured product of the prepreg 1 shown in FIG. 1, and a metal foil 13 laminated with the insulating layer 12. Specifically, the metal-clad laminate 11 includes the insulating layer 12 containing the cured product of the resin composition, and the metal foil 13 provided over the insulating layer 12. The insulating layer 12 may contain a cured product of the resin composition, or may contain a cured product of the prepreg. The thickness of the metal foil 13 is not particularly limited because it varies depending on the properties required for a wiring board and the like to be finally obtained. The thickness of the metal foil 13 may be properly set according to a desired purpose, and for example, is preferably 0.2 to 70 μm. Examples of the metal foil 13 include a copper foil and an aluminum foil, and an exemplary thin metal foil may be in the form of a copper foil with a carrier including a peelable layer and the carrier in order to improve the handleability.

The method for manufacturing the metal-clad laminate 11 is not particularly limited as long as the metal-clad laminate 11 can be manufactured. Specific examples thereof include a method of manufacturing a metal-clad laminate 11 by use of the prepreg 1. Examples of this method includes: stacking one or a plurality of prepregs 1; placing a metal foil 13 such as a copper foil over either both upper and lower surfaces or one of the surfaces of the prepreg 1; and heating, pressurizing, and molding the metal foil 13 and the prepreg 1 to be integrally laminated, thereby manufacturing a double-sided metal foil-clad or single-sided metal foil-clad laminate 11. In other words, the metal-clad laminate 11 is obtainable by laminating the metal foil 13 over the prepreg 1 and heating, pressurizing, and molding the laminate. The heating and pressurizing conditions can be appropriately set depending on the thickness of the metal-clad laminate 11 to be manufactured and the type of the composition and the like of the prepreg 1. For example, the temperature can be set to the range of 170 to 210° C., the pressure can be set to the range of 3.5 to 4 MPa, and the time can be set to the range of 60 to 150 minutes. The metal-clad laminate may be manufactured without using a prepreg. For example, there is a way of applying a varnish-like resin composition on a metal foil to form a layer containing the resin composition on the metal foil, and thereafter performing the heating and pressurizing.

The metal-clad laminate including an insulating layer containing a cured product of the resin composition according to the present embodiment is a metal-clad laminate including an insulating layer having low dielectric characteristics, a high thermal conductivity, and being hardly susceptible to a variation in an external environment such as the humidity (exhibiting a low moisture absorption). Further, the metal-clad laminate has an excellent moldability.

Wiring Board

Figure 3:
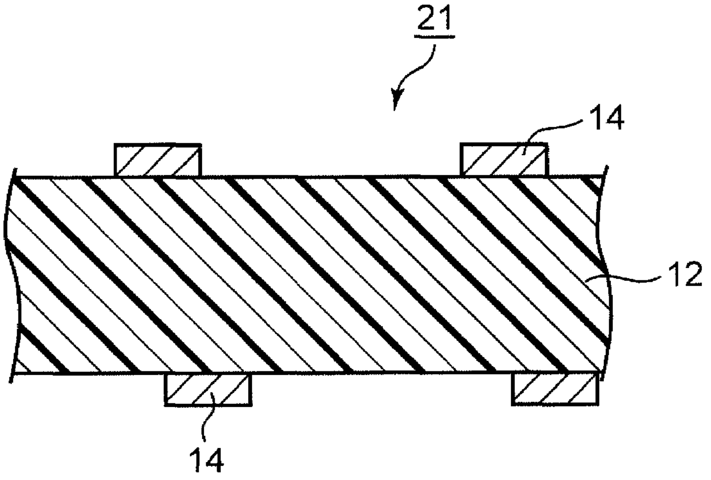
FIG. 3 is a schematic cross-sectional view showing an example of a wiring board according to an embodiment of the present invention.

FIG. 3 is a schematic cross-sectional view showing an example of the wiring board 21 according to an embodiment of the present invention.

As shown in FIG. 3, a wiring board 21 according to the present embodiment includes an insulating layer 12 obtained by curing the prepreg 1 shown in FIG. 1, and wiring 14 which is laminated with the insulating layer 12 and is obtained by partly removing the metal foil 13. In other words, the wiring board 21 includes the insulating layer 12 containing the cured product of the resin composition and wiring 14 provided on the insulating layer 12. The insulating layer 12 may contain a cured product of the resin composition, or a cured product of the prepreg.

The method for manufacturing the wiring board 21 is not particularly limited as long as the wiring board 21 can be manufactured. Specific examples thereof include a method of manufacturing a wiring board 21 by use of the prepreg 1. Examples of the method include etching the metal foil 13 on the surface of the metal-clad laminate 11 prepared in the above-described manner to form wiring serving as a circuit on a surface of the insulating layer 12. In this way, the wiring board 21 provided with the wiring is manufactured. In other words, the wiring board 21 is obtainable by partly removing the metal foil 13 on the surface of the metal-clad laminate 11 to form the circuit. Examples of ways of forming a circuit include, other than the way described above, a circuit formation according to Semi Additive Process (SAP) and Modified Semi Additive Process (MSAP). The wiring board 21 includes an insulating layer 12 which has low dielectric characteristics, a high heat resistance, and can suitably maintain the low dielectric characteristics even after having undergone a water absorption process.

The wiring board includes an insulating layer having low dielectric characteristics, a high thermal conductivity, and being hardly susceptible to a variation in an external environment such as the humidity (i.e., exhibiting a low moisture absorption).

Metal Foil with a Resin

Figure 4:
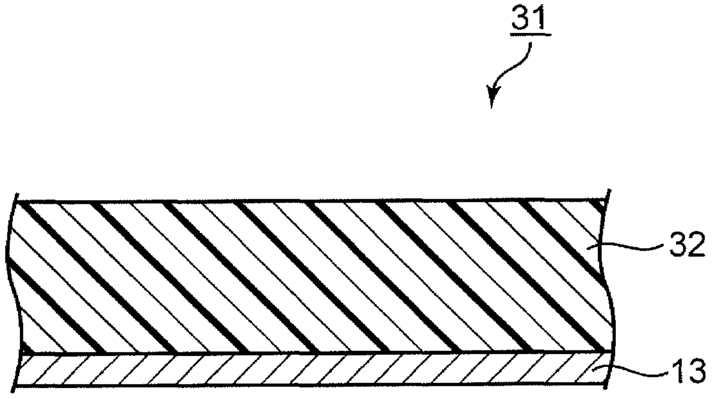
FIG. 4 is a schematic cross-sectional view showing an example of a metal foil with a resin according to an embodiment of the present invention.

FIG. 4 is a schematic cross-sectional view showing an example of the metal foil with a resin 31 according to an embodiment of the present invention.

As shown in FIG. 4, a metal foil with a resin 31 according to the present embodiment includes a resin layer 32 containing the resin composition or a semi-cured product of the resin composition and a metal foil 13. The metal foil with a resin 31 includes a metal foil 13 on a surface of the resin layer 32. In other words, this metal foil with a resin 31 includes the resin layer 32, and the metal foil 13 laminated with the resin layer 32. The metal foil with a resin 31 may include another layer between the resin layer 32 and the metal foil 13.

The resin layer 32 may contain a semi-cured product of the resin composition as described above, or may contain an uncured resin composition itself. Specifically, the metal foil with a resin 31 may include a resin layer containing a semi-cured product of the resin composition (the B-stage resin composition) and a metal foil, or include a resin layer containing the resin composition to be cured (the A-stage resin composition) and a metal foil. It is sufficient that the resin layer contains the resin composition or a semi-cured product of the resin composition, and may or may not contain a fibrous base material. The resin composition or the semi-cured product of the resin composition may be obtained by drying, or heating and drying the resin composition. The same fibrous base material as that of the prepreg may be used as the fibrous base material.

As the metal foil, a metal foil used for a metal-clad laminate may be used without a limitation. Examples of the metal foil include a copper foil and an aluminum foil.

The metal foil with a resin 31 and the film with a resin 41 may include a cover film as needed. The cover film included therein can prevent an infiltration of a foreign matter and the like. The cover film is not particularly limited, but examples thereof include a polyolefin film, a polyester film, a polymethylpentene film, and each of the films formed with a release agent layer.

The method for manufacturing the metal foil with a resin 31 is not particularly limited as long as the metal foil with a resin 31 can be manufactured. Examples of the method for manufacturing the metal foil with a resin 31 include a manufacturing method including applying the varnish-like resin composition (resin varnish) over the metal foil 13, and thereafter performing the heating. The varnish-like resin composition is applied over the metal foil 13, for example, by use of a bar coater. The applied resin composition is heated under conditions, for example, at 80° C. or more and 180° C. or less for 1 minute or more and 10 minutes or less. The heated resin composition is formed on the metal foil 13 as an uncured resin layer 32. The heating can volatize the organic solvent from the resin varnish to thereby reduce or remove the organic solvent.

From a metal foil with a resin including a resin layer containing the resin composition according to the present embodiment or a semi-cured product of the resin composition, a cured product having low dielectric characteristics, a high thermal conductivity, and being hardly susceptible to a variation in an external environment such as the humidity (i.e., exhibiting a low moisture absorption) can be suitably obtained. Further, the metal foil with a resin has an excellent moldability.

Film with a Resin

Figure 5:
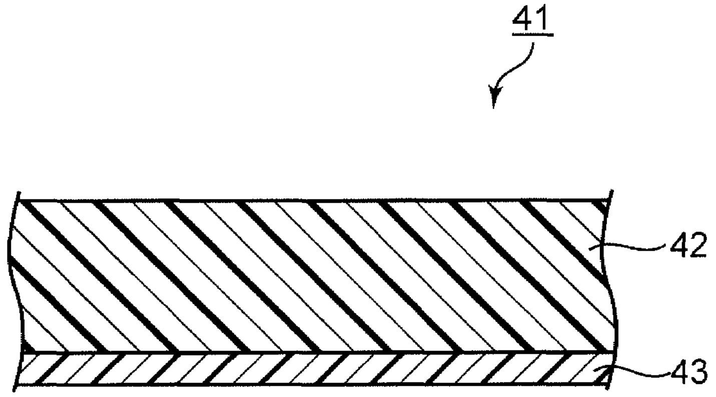
FIG. 5 is a schematic cross-sectional view showing an example of a film with a resin according to an embodiment of the present invention.

FIG. 5 is a schematic cross-sectional view showing an example of a film with a resin 41 according to an embodiment of the present invention.

As shown in FIG. 5, a film with a resin 41 according to the present embodiment includes a resin layer 42 containing the resin composition or a semi-cured product of the resin composition, and a support film 43. The film with a resin 41 includes the resin layer 42, and the support film 43 laminated with the resin layer 42. The film with a resin 41 may include another layer between the resin layer 42 and the support film 43.

The resin layer 42 may contain a semi-cured product of the resin composition as described above, or may contain an uncured resin composition itself. Specifically, the film with a resin 41 may include a resin layer containing a semi-cured product of the resin composition (the B-stage resin composition) and a support film, or include a resin layer containing the resin composition to be cured (the A-stage resin composition) and a support film. It is sufficient that the resin layer contains the resin composition or a semi-cured product of the resin composition, and may or may not contain a fibrous base material. The resin composition or the semi-cured product of the resin composition may be obtained by drying, or heating and drying the resin composition. The same fibrous base material as that of the prepreg may be used as the fibrous base material.

As the support film 43, a support film used for a film with a resin may be used without a limitation. Examples of the support film include electrical insulating films such as a polyester film, a polyethylene terephthalate (PET) film, a polyimide film, a polyparabanic acid film, a polyetheretherketone film, a polyphenylene sulfide film, a polyamide film, a polycarbonate film, and a polyarylate film.

The film with a resin 41 may include a cover film as needed. The cover film included therein can prevent an infiltration of a foreign matter and the like. The cover film is not particularly limited, but examples thereof include a polyolefin film, a polyester film, and a polymethylpentene film.

As the support film and the cover film, the one having undergone a surface treatment such as a matt finishing, a corona treatment, a releasing treatment, and a roughening treatment can be used as needed.

The method for manufacturing the film with a resin 41 is not particularly limited as long as the film with a resin 41 can be manufactured. Examples of the method for manufacturing the film with a resin 41 include a manufacturing method including applying the varnish-like resin composition (resin varnish) over the support film 43, and thereafter performing the heating. The varnish-like resin composition is applied over the support film 43, for example, using a bar coater. The applied resin composition is heated under conditions, for example, at 80° C. or more and 180° C. or less for 1 minute or more and 10 minutes or less. The heated resin composition is formed on the support film 43 as an uncured resin layer 42. The heating can volatize the organic solvent from the resin varnish to thereby reduce or remove the organic solvent.

From a film with a resin including a resin layer containing the resin composition according to the present embodiment or a semi-cured product of the resin composition, a cured product having low dielectric characteristics, a high thermal conductivity, and being hardly susceptible to a variation in an external environment such as the humidity (i.e., exhibiting a low moisture absorption) can be suitably obtained. Further, the film with a resin has an excellent moldability.

The present invention will be further specifically described by way of Examples hereinafter. However, the scope of the present invention is not limited thereto.

EXAMPLES

Examples 1 to 15, Comparative Examples 1 to 6

Each component used in preparing the resin composition in the Examples will be described.

Polyphenylene Ether Compound

PPE 1: Polyphenylene ether compound having a methacryloyl group at a molecular end (a modified polyphenylene ether having a terminal hydroxyl group of the polyphenylene ether modified by a methacryloyl group, a modified polyphenylene ether compound expressed by the formula (15), where Y in the formula (15) represents a dimethylmethylene group (expressed by the formula (12), where $R_{33}$ and $R_{34}$ in the formula (12) represent a methyl group), SA9000 manufactured by SABIC Innovative Plastics IP BV, weight average molecular weight Mw: 2000, number of terminal functional groups: 2)

PPE 2 is modified polyphenylene ether obtained by causing polyphenylene ether and chloromethylstyrene to react with each other. Specifically, the modified polyphenylene ether is obtained by causing a reaction in the following manner.

First, 200 g of polyphenylene ether (SA90 manufactured by SABIC Innovative Plastics IP BV, number of terminal hydroxyl groups: 2, weight average molecular weight Mw: 1700), 30 g of a mixture containing p-chloromethylstyrene and m-chloromethylstyrene at a mass ratio of 50:50 (chloromethylstyrene: CMS manufactured by Tokyo Chemical Industry Co., Ltd.), 1.227 g of tetra-n-butylammonium bromide as a phase transfer catalyst, and 400 g of toluene were introduced into a 1-liter three-necked flask equipped with a temperature controller, a stirrer, cooling equipment, and a dropping funnel and stirred. Moreover, the mixture was stirred until polyphenylene ether, chloromethylstyrene, and tetra-n-butylammonium bromide were dissolved in toluene. At that time, the mixture was gradually heated until the liquid temperature finally reached 75° C. Thereafter, an aqueous sodium hydroxide solution (20 g of sodium hydroxide/20 g of water) as an alkali metal hydroxide was added dropwise to the solution over 20 minutes. Thereafter, the mixture was further stirred at 75° C. for 4 hours. Next, the resultant in the flask was neutralized with hydrochloric acid at 10 mass % and then a large amount of methanol was added into the flask. This caused the generation of a precipitate in the liquid in the flask. In other words, the product contained in the reaction solution in the flask was reprecipitated. Thereafter, this precipitate was taken out by filtration, washed three times with a mixed solution of methanol and water contained at a mass ratio of 80:20, and then dried under reduced pressure at 80° C. for 3 hours.

The obtained solid was analyzed by $^1$H-NMR (400 MHz, $CDCl_3$, TMS). As a result of NMR measurement, a peak attributed to a vinylbenzyl group (ethenylbenzyl group) was observed at 5 to 7 ppm. This made it possible to confirm that the obtained solid was a modified polyphenylene ether compound having a vinylbenzyl group (ethenylbenzyl group) as the substituent at the molecular terminal end in the molecule. Specifically, it was confirmed that the solid obtained was ethenylbenzylated polyphenylene ether. This obtained modified polyphenylene ether compound was a modified polyphenylene ether compound expressed by formula (14), where Y represents a dimethylmethylene group (a group expressed by formula (12), where $R_{33}$ and $R_{34}$ in formula (12) represent a methyl group), Z represents a phenylene group, $R_1$ to $R_3$ each represent a hydrogen atom, and n denotes 1.

The number of terminal functional groups in the modified polyphenylene ether was measured as follows.

First, the modified polyphenylene ether was accurately weighed. The weight at that time is defined as X (mg). Thereafter, this modified polyphenylene ether weighed was dissolved in 25 mL of methylene chloride, 100 μL of an ethanol solution of tetraethylammonium hydroxide (TEAH) at 10 mass % (TEAH: ethanol (volume ratio)=15: 85) was added to the solution, and then the absorbance (Abs) of this mixture at 318 nm was measured using a UV spectrophotometer (UV-1600 manufactured by Shimadzu Corporation). Thereafter, the number of terminal hydroxyl groups in the modified polyphenylene ether was calculated from the measurement result using the following equation.

$$\text{Residual OH amount } (\mu mol/g) = [(25 \times Abs)/(\varepsilon \times OPL \times X)] \times 10^6$$

Here, ε represents the extinction coefficient and is 4700 L/mol·cm. OPL represents the cell path length and is 1 cm.

Since the calculated residual OH amount (the number of terminal hydroxyl groups) in the modified polyphenylene ether is almost zero, it was found that the hydroxyl groups in the polyphenylene ether before being modified were almost modified. From this fact, it was found that the number of terminal hydroxyl groups decreased from the number of terminal hydroxyl groups in polyphenylene ether before being modified is the number of terminal hydroxyl groups in polyphenylene ether before being modified. In other words, it was found that the number of terminal hydroxyl groups in polyphenylene ether before being modified is the number of terminal functional groups in the modified polyphenylene ether. That is, the number of terminal functional groups was two.

The intrinsic viscosity (IV) of the modified polyphenylene ether was measured in methylene chloride at 25° C. Specifically, the intrinsic viscosity (IV) of the modified polyphenylene ether was measured in a methylene chloride solution (liquid temperature: 25° C.) of the modified polyphenylene ether at 0.18 g/45 ml using a viscometer (AVS500 Visco System manufactured by SCHOTT Instruments GmbH). As a result, the intrinsic viscosity (IV) of the modified polyphenylene ether was 0.086 dl/g.

The molecular weight distribution of the modified polyphenylene ether was measured by GPC. Moreover, the weight average molecular weight (Mw) was calculated from the obtained molecular weight distribution. As a result, Mw was 2,300.

Curing Agent

TAIC: triallyl isocyanurate (TAIL manufactured by Nihon Kasei Co., Ltd)

DVB: divinylbenzene (manufactured by Nippon Steel & Sumitomo Metal Corporation)

Reaction Initiator

Peroxide Initiator: PBP (1,3-bis (butylperoxyisopropyl) benzene; Perbutyl P manufactured by NOF CORPORATION)

Styrene-Based Polymer

SIBSTAR073T: Styrene-isobutylene-styrene-based triblock copolymer (manufactured by Kaneka Corporation, number average molecular weight: 66,000, mole fraction of styrene: 30%)

SIBSTAR103T: Styrene-isobutylene-styrene-based triblock copolymer (manufactured by Kaneka Corporation, number average molecular weight: 85,000, mole fraction of styrene: 30%)

SIBSTAR102T: Styrene-isobutylene-styrene-based triblock copolymer (manufactured by Kaneka Corporation, number average molecular weight: 84,000, mole fraction of styrene: 30%)

H1041: Hydrogenated styrene-based thermoplastic elastomer (SEBS) ("Tuftec (registered trademark) H1041" manufactured by Asahi Kasei Corporation, number average molecular weight: 54,000, mole fraction of styrene: 30%)

P2000: Hydrogenated styrene-based thermoplastic elastomer (SEBS) ("Tuftec (registered trademark) P2000"

manufactured by Asahi Kasei Corporation, number average molecular weight: 40,000, mole fraction of styrene: 67%)

Inorganic Filler

Boron nitride 1: "AP-10S" manufactured by MARUKA Corporation, volume average particle diameter: 3.0 μm Boron nitride 2: "AP-20S" manufactured by MARUKA Corporation, volume average particle diameter: 2.0 μm Boron nitride 3: "SGP" manufactured by Denka Company Limited, volume average particle diameter: 18 μm Silica: "FB-7SDC" manufactured by Denka Company Limited, volume average particle diameter: 5 μm Alumina: "DAW-03AC" manufactured by Denka Company Limited, volume average particle diameter: 8 μm Silicon nitride: "SSN-β1" manufactured by Shinano Electric Refining Co., Ltd., volume average particle diameter: 1 μm Synthetic magnesite: granular anhydrous magnesium carbonate (MAGTHERMO MS-L manufactured by Konoshima Chemical Co., Ltd., volume average particle diameter: 8 μm Preparation Method First, each component other than the inorganic filler was added to toluene at a composition (parts by mass) shown in Tables 1 to 3 and mixed therewith. The mixture was stirred for 60 minutes. Subsequently, the obtained liquid was added with the filler (parts by mass), the toluene content to be added was adjusted such that the resin composition resulting from the dispersion has the solid concentration of 65 parts by mass, and then the liquid was stirred for 60 minutes. A first filler dispersion was thus carried out. Thereafter, a second dispersion of the inorganic filler was carried out by a bead mill. A varnish-like resin composition (varnish) was thus obtained.

Subsequently, Evaluation Substrate (cured product of prepreg) 1 was obtained in the following manner.

A fibrous base material (glass cloth: #1078 type manufactured by Asahi Kasei Corporation, an L glass) was impregnated with the obtained varnish, and was then heated and dried at 120° C. for 3 minutes to manufacture a prepreg. Subsequently, each obtained prepreg was cut into a square with a side of 200 mm, and one, two or four stacked prepreg sheets were each laminated with a copper foil ("FV-WS" manufactured by Furukawa Electric Co., Ltd., copper foil thickness: 35 μm) over both surfaces of the respective prepreg sheet, were heated to the temperature of 200° C. at a temperature raise rate of 4° C./min., were then heated and pressurized under conditions of the temperature of 200° C. and the pressure of 3 MPa for 120 minutes to manufacture copper-clad laminates (Evaluation Substrates 1) of three thickness types.

Further, as Evaluation Substrate (cured product of prepreg) 2, the above-obtained four stacked prepreg sheets each cut into the square with a side of 200 mm was used to prepare Evaluation Substrates 2 in same manner as Evaluation Substrates 1 apart from the pressure being set to 4 MPa during the heating and pressurizing.

Both of a sample obtained by removing the copper foil from the copper-clad laminate of four stacked prepreg sheets of Evaluation Substrate 1 and a sample obtained by removing the copper foil from the copper-clad laminate of Evaluation Substrate 2 were used for the evaluation on the moldability described below. Further, samples (cured products of prepreg) obtained by removing the respective copper foils from the cured product of one prepreg sheet and from the copper-clad laminate of two stacked prepreg sheets of the Evaluation Substrates were used for the measurement of the thermal conductivity described below. A sample (cured product of prepreg) obtained by removing the copper foil from the copper-clad laminate of four stacked prepreg sheets of the Evaluation Substrate was used in the evaluation tests on the dielectric characteristics (relative dielectric constant) and the moisture absorption. Regarding the substrates used for the evaluation tests on the thermal conductivity, the dielectric characteristics (relative dielectric constant), and the moisture absorption, Evaluation Substrate 2 was used in Examples 17, 19, 20, and Comparative Example 6, and Evaluation Substrate 1 was used in all the other Examples and Comparative Examples. However, in Comparative Example 4, both the Evaluation Substrates showed poor moldability, which made it impossible to evaluate the thermal conductivity, the dielectric characteristics (relative dielectric constant), and the moisture absorption thereof.

The Evaluation Substrates (cured product of prepreg) prepared in this way were evaluated in accordance with the method described below.

Dielectric Characteristics (Dielectric Loss Tangent)

The dielectric loss tangent (DO of Evaluation Substrate (cured product of prepreg) at 10 GHz was measured in accordance with Cavity Resonator Perturbation Method. Specifically, the dielectric loss tangent of the Evaluation Substrate at 10 GHz was measured using a Network Analyzer (N5230A manufactured by Keysight Technologies Kabushiki Kaisha). The acceptance criterion in the present Example was Df≤0.0032.

Moisture Absorption

Three sheets of each Evaluation Substrate obtained by cutting the molded and thus obtained cured products into a square with a side of 50 mm were prepared, were put in a Highly Accelerated Stress Test chamber set at a temperature of 121° C. and with the humidity of 100%, and the moisture absorption of the sheets before and after the process was measured. Specifically, a PCT chamber (PC-242HSR2 manufactured by HIRAYAMA Manufacturing Corporation) was used, weights of the samples (Evaluation Substrates: cured products of prepreg) before and after the process were measured, and the moisture absorption was calculated on the basis of an average value of three samples. The acceptance criterion in the present Example was: moisture absorption≤0.4%.

Moldability

Cross-sections of the thus-prepared Evaluation Substrates 1 and 2 were observed to ascertain the presence or the absence of a void or a scratch by a scanning electron microscope (S-3000N manufactured by Hitachi High-Tech Fielding Corporation). As evaluation criteria, an Evaluation Substrate with no void or scratch observed was evaluated as "good", whereas the one with some void or scratch observed was evaluated as "unacceptable".

Thermal Conductivity

The thermal conductivity of the obtained Evaluation Substrates (cured products of prepreg) was measured in a way in conformity with ASTM D5470. Specifically, a thermal property tester (T3Ster DynTIM Tester manufactured by Mentor Graphics Corporation) was used to measure the thermal conductivity of the obtained Evaluation Substrates (cured products of prepreg). The acceptance criterion of the thermal conductivity in the present Example was 1.0 W/m·K or more.

The results in the evaluations are shown in Tables 1 to 3.

| | | | Example 1 | Example 2 | Example 3 | Example 4 | Example 5 |
|---|---|---|---|---|---|---|---|
| Organic resin component (parts by mass) | PPE 1 | | 57 | 57 | 57 | 68 | |
| | PPE 2 | | | | | | 57 |
| | Curing agent | TAIC | 28 | 28 | 28 | 17 | 28 |
| | | DVP | | | | | |
| | Reaction initiator | PBP | 1 | 1 | 1 | 1 | 1 |
| | Styrene-based polymer (SIBS) | SIBSTAR073T | 15 | | | | |
| | | SIBSTAR103T | | 15 | | 15 | 15 |
| | | SIBSTAR102T | | | 15 | | |
| | Styrene-based polymer (SEBS) | H1041 | | | | | |
| | | P2000 | | | | | |
| Boron nitride filler | Boron nitride | AP-10S | 81 | 81 | 81 | 81 | 81 |
| | | AP-20S | | | | | |
| | | SGP | | | | | |
| Filler other than boron nitride | Silica | FB-7SDC | 37 | 37 | 37 | 37 | 37 |
| | Alumina | DAW-03AC | | | | | |
| | Silicon nitride | SSN-β1 | | | | | |
| | Anhydrous synthetic magnesium | MAGTHERMO MSL | | | | | |
| Filler Content relative to 100 parts by weight of total of PPE + Curing agent + Styrene-based polymer (parts by mass) | | | 118 | 118 | 118 | 118 | 118 |
| Evaluation Result | Df | | 0.002 | 0.0022 | 0.0021 | 0.0022 | 0.0022 |
| | Moisture absorption | | 0.38 | 0.2 | 0.21 | 0.19 | 0.27 |
| | Moldability-Evaluation Substrate 1 | | good | good | good | good | good |
| | Moldability-Evaluation Substrate 2 | | good | good | good | good | good |
| | Thermal conductivity | | 1.3 | 1.3 | 1.3 | 1.3 | 1.3 |

| | | | Example 6 | Example 7 | Example 8 | Example 9 | Example 10 |
|---|---|---|---|---|---|---|---|
| Organic resin component (parts by mass) | PPE 1 | | 68 | 57 | 57 | 57 | 57 |
| | PPE 2 | | | | | | |
| | Curing agent | TAIC | | 28 | 28 | 28 | 28 |
| | | DVP | 17 | | | | |
| | Reaction initiator | PBP | 1 | 1 | 1 | 1 | 1 |
| | Styrene-based polymer (SIBS) | SIBSTAR073T | | | | | |
| | | SIBSTAR103T | 15 | 15 | 15 | 15 | 15 |
| | | SIBSTAR102T | | | | | |
| | Styrene-based polymer (SEBS) | H1041 | | | | | |
| | | P2000 | | | | | |
| Boron nitride filler | Boron nitride | AP-10S | 81 | | 80 | 80 | 80 |
| | | AP-20S | | 81 | | | |
| | | SGP | | | | | |
| Filler other than boron nitride | Silica | FB-7SDC | 37 | 37 | 100 | 140 | 120 |
| | Alumina | DAW-03AC | | | | | 20 |
| | Silicon nitride | SSN-β1 | | | | | |
| | Anhydrous synthetic magnesium | MAGTHERMO MSL | | | | | |
| Filler Content relative to 100 parts by weight of total of PPE + Curing agent + Styrene-based polymer (parts by mass) | | | 118 | 118 | 180 | 220 | 220 |
| Evaluation Result | Df | | 0.0024 | 0.0023 | 0.0026 | 0.0027 | 0.0028 |
| | Moisture absorption | | 0.38 | 0.33 | 0.38 | 0.36 | 0.35 |
| | Moldability-Evaluation Substrate 1 | | good | good | good | good | good |

-continued

| | | | | | |
|---|---|---|---|---|---|
| Moldability-Evaluation Substrate 2 | good | good | good | good | good |
| Thermal conductivity | 1.3 | 1.3 | 1.4 | 1.4 | 1.4 |

TABLE 2

| | | | Example 11 | Example 12 | Example 13 | Example 14 | Example 15 | Example 16 | Example 17 | Example 18 | Example 19 | Example 20 |
|---|---|---|---|---|---|---|---|---|---|---|---|---|
| Organic resin component (parts by mass) | PPE 1 | | 60 | 53 | 60 | 53 | 53 | 70 | 70 | 70 | 70 | 70 |
| | PPE 2 | | | | | | | | | | | |
| | Curing agent | TAIC | 30 | 27 | 30 | 27 | 27 | 30 | 30 | 30 | 30 | 30 |
| | | DVP | | | | | | | | | | |
| | Reaction initiator | PBP | 1 | 1 | 1 | 1 | 1 | 1 | 1 | 1 | 1 | 1 |
| | Styrene-based polymer (SIBS) | SIBSTAR073T | | | | | | | | | | |
| | | SIBSTAR103T | 15 | 15 | 10 | 20 | 15 | 15 | 15 | 15 | 15 | 15 |
| | | SIBSTAR102T | | | | | | | | | | |
| | Styrene-based polymer (SEBS) | H1041 | | | | | | | | | | |
| | | P2000 | | | | | | | | | | |
| Boron nitride filler | Boron nitride | AP-10S | 80 | 80 | 81 | 81 | | 60 | 80 | | | |
| | | AP-20S | | | | | 41 | | | | | |
| | | SGP | | | | | 41 | | | 69 | 115 | 138 |
| Filler other than boron nitride | Silica | FB-7SDC | 120 | 120 | 37 | 37 | 37 | 200 | 200 | 230 | 230 | 230 |
| | Alumina | DAW-03AC | | | | | | | | | | |
| | Silicon nitride | SSN-β1 | 20 | | | | | | | | | |
| | Anhydrous synthetic magnesium | MAGTHERMO MSL | | 20 | | | | | | | | |
| Filler Content relative to 100 parts by weight of total of PPE + Curing agent + Styrene-based polymer (parts by mass) | | | 220 | 220 | 118 | 118 | 119 | 226 | 243 | 260 | 300 | 320 |
| Evaluation Result | Df | | 0.0028 | 0.003 | 0.0025 | 0.002 | 0.0022 | 0.003 | 0.0031 | 0.003 | 0.0031 | 0.0032 |
| | Moisture absorption | | 0.35 | 0.39 | 0.3 | 0.17 | 0.35 | 0.31 | 0.31 | 0.3 | 0.35 | 0.37 |
| | Moldability-Evaluation Substrate 1 | | good | good | good | good | good | good | unacceptable | good | unacceptable | unacceptable |
| | Moldability-Evaluation Substrate 2 | | good | good | good | good | good | good | good | good | good | good |
| | Thermal conductivity | | 1.5 | 1,4 | 1.3 | 1.3 | 1.1 | 1.5 | 1.6 | 1.2 | 1.3 | 1.5 |

TABLE 3

| | | | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|---|
| Organic resin component (parts by mass) | PPE 1 | | 57 | 57 | 57 | 70 | 57 | 70 | 57 |
| | PPE 2 | | | | | | | | |
| | Curing agent | TAIC | 28 | 28 | 28 | 30 | 28 | 30 | 28 |
| | | DVP | | | | | | | |
| | Reaction initiator | PBP | I | 1 | 1 | 1 | 1 | 1 | 1 |
| | Styrene-based polymer (SIBS) | SIBSTAR073T | | | | | | | |
| | | SIBSTAR103T | | | | 15 | 15 | 15 | 15 |
| | | SIBSTAR102T | | | | | | | |
| | Styrene-based polymer (SEBS) | H1041 | 15 | | | | | | |
| | | P2000 | | 15 | | | | | |
| Boron nitride filler | Boron nitride | AP-10S | 81 | 81 | 81 | | | | 37 |
| | | AP-20S | | | | | | | |
| | | SGP | | | | 150 | | | |

TABLE 3-continued

| | | | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|---|
| Filler other than boron nitride | Silica | FB-7SDC | 37 | 37 | 37 | 230 | 200 | 368 | 37 |
| | Alumina | DAW-03AC | | | | | | | |
| | Silicon nitride | SSN-B1 | | | | | | | |
| | Anhydrous synthetic magnesium | MAGTHERMO MSL | | | | | | | |
| Filler Content relative to 100 parts by weight of total of PPE + Curing agent + Styrene-based polymer (parts by mass) | | | 118 | 118 | 118 | 330 | 200 | 320 | 74 |
| Evaluation Result | Df | | 0.0019 | 0.0021 | 0.0024 | — | 0.0027 | 0.0034 | 0.002 |
| | Moisture absorption | | 0.48 | 0.42 | 0.5 | — | 0.28 | 0.3 | 0.18 |
| | Moldability-Evaluation Substrate 1 | | good | good | good | unacceptable | good | unacceptable | good |
| | Moldability-Evaluation Substrate 2 | | good | good | good | unacceptable | good | good | good |
| | Thermal conductivity | | 1.3 | 1.3 | 1.2 | — | 0.9 | 1.0 | 0.9 |

Observations

As can be seen from Tables 1 and 2, all the Examples with the use of the resin composition of the present invention demonstrate that it is possible to provide a resin composition from which a cured product having low dielectric characteristics, a high thermal conductivity, and low moisture absorption is obtainable, the resin composition further exhibiting an excellent moldability.

In contrast, as can be seen from Table 3, Comparative Examples 1 and 2 with the use of a hydrogenated styrene-based thermoplastic elastomer (SEBS) in place of the styrene-based polymer of the present invention show excessively high moisture absorption. Comparative Example 3 with no styrene-based polymer content further shows a decreased thermal conductivity as well as a higher moisture absorption. Furthermore, it can be seen that Comparative Example 4 with an excessively high total content of inorganic fillers fails to ensure a sufficient moldability. Comparative Examples 5 to 6 with no boron nitride content as an inorganic filler and Comparative Example 7 with the boron nitride content but with an excessively low total content of inorganic fillers fail to ensure a sufficient thermal conductivity.

This application is based on Japanese Patent Application No. 2020-122559 filed on Jul. 17, 2020, the contents of which are incorporated in the present application.

While the present invention are fully and appropriately described in the above by way of embodiments with reference to specific examples and drawings in order to express the present invention, it is to be recognized that those skilled in the art can readily change and/or modify the embodiments described above. Therefore, it is to be construed that the changes or modifications made by those skilled in the art are encompassed within the scope of the claims unless those changes or modifications are at a level that departs from the scope of the claims described in the claims section of the present application.

INDUSTRIAL APPLICABILITY

The present invention has a wide range of industrial applicability in the technical field related to an electronic material and various devices using the same.

The invention claimed is:

1. A resin composition, comprising:

a polyphenylene ether compound having at least one of groups expressed by the following formulas (1) and (2);

a curing agent reactable with the polyphenylene ether compound;

a styrene-based polymer having structural units expressed by the following formulas (3) and (4); and an inorganic filler containing boron nitride, wherein the styrene-based polymer includes a styrene-isobutylene-styrene block copolymer;

a content of the inorganic filler is 100 to 320 parts by mass relative to 100 parts by mass of a total of the polyphenylene ether compound, the curing agent, and the styrene-based polymer; and wherein a cured product of the resin composition has a dielectric loss tangent at a frequency of 10 GHz of 0.0032 or less, (1)

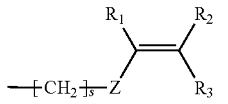

wherein in formula (1), s denotes an integer of 0 to 10, Z represents an arylene group, and $R_1$ to $R_3$ each independently represents a hydrogen atom or an alkyl group;

(2)

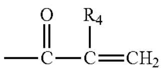

wherein in formula (2), $R_4$ represents a hydrogen atom or an alkyl group;

(3)

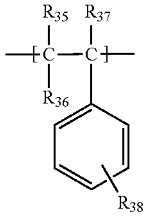

(4)

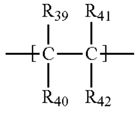

wherein in formula (3), $R_{35}$ to $R_{37}$ each independently represents a hydrogen atom or an alkyl group, and $R_{38}$ represents a hydrogen atom or an alkyl group; and wherein in formula (4), $R_{39}$ to $R_{42}$ each independently represents a hydrogen atom or an alkyl group, and when $R_{39}$ and $R_{40}$ each independently represents an alkyl group, $R_{41}$ and $R_{42}$ each represents a hydrogen atom, and alternatively, when $R_{41}$ and $R_{42}$ each independently represents an alkyl group, $R_{39}$ and $R_{40}$ each represents a hydrogen atom.

2. The resin composition according to claim 1, wherein the curing agent contains at least one selected from a group consisting of:

a polyfunctional acrylate compound having two or more acryloyl groups in a molecule; a polyfunctional methacrylate compound having two or more methacryloyl groups in a molecule; a polyfunctional vinyl compound having two or more vinyl groups in a molecule; a styrene derivative; an allyl compound having an allyl group in a molecule; a maleimide compound having a maleimide group in a molecule; an acenaphthylene compound having an acenaphthylene structure in a molecule; and an isocyanurate compound having an isocyanurate group in a molecule.

3. The resin composition according to claim 1, wherein the inorganic filler further contains at least one selected from a group consisting of silica, anhydrous magnesium carbonate, alumina and silicon nitride.

4. The resin composition according to claim 1, wherein the polyphenylene ether compound has a group expressed by formula (2).

5. The resin composition according to claim 1, wherein a content of the styrene-based polymer is 5 to 25 parts by mass relative to 100 parts by mass of the total of the polyphenylene ether compound, the curing agent, and the styrene-based polymer.

6. The resin composition according to claim 1, wherein a content of the polyphenylene ether compound is 50 to 90 parts by mass relative to 100 parts by mass of the total of the polyphenylene ether compound, the curing agent, and the styrene-based polymer.

7. The resin composition according to claim 1, wherein a mole fraction of the structural unit expressed by formula (3) is 5 to 50 mol % in the styrene-based polymer.

8. The resin composition according to claim 1, wherein the styrene-based polymer has a weight average molecular weight of 10,000 to 200,000.

9. The resin composition according to claim 1, wherein the styrene-based polymer includes a structural unit expressed by the following formula (5):

(5)

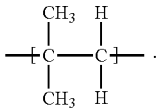

10. The resin composition according to claim 1, wherein the inorganic filler contains silica and boron nitride.

11. The resin composition according to claim 10, wherein the inorganic filler contains silica and boron nitride at ratios (of silica to boron nitride) ranging from 80:20 to 20:80.

12. The resin composition according to claim 1, wherein a cured product of the resin composition has a thermal conductivity of 1.0 W/m·K or more, and a dielectric loss tangent at a frequency of 10 GHz of 0.003 or less.

13. A prepreg, comprising:

the resin composition according to claim 1 or a semi-cured product of the resin composition; and a fibrous base material.

14. A metal-clad laminate, comprising:

an insulating layer containing a cured product of the prepreg according to claim 13; and a metal foil.

15. A wiring board, comprising:

an insulating layer containing a cured product of the prepreg according to claim 13; and wiring.

16. A film with a resin, comprising:

a resin layer containing the resin composition according to claim 1 or a semi-cured product of the resin composition; and a support film.

17. A metal foil with a resin, comprising:

a resin layer containing the resin composition according to claim 1 or a semi-cured product of the resin composition; and a metal foil.

18. A metal-clad laminate, comprising:

an insulating layer containing a cured product of the resin composition according to claim 1; and a metal foil.

19. A wiring board, comprising:

an insulating layer containing a cured product of the resin composition according to claim 1; and wiring.

* * * * *